United States Patent
Fisch et al.

(10) Patent No.: US 8,064,274 B2
(45) Date of Patent: Nov. 22, 2011

(54) INTEGRATED CIRCUIT HAVING VOLTAGE GENERATION CIRCUITRY FOR MEMORY CELL ARRAY, AND METHOD OF OPERATING AND/OR CONTROLLING SAME

(75) Inventors: David Fisch, Ecublens (CH); Philippe Bauser, Sauverny (FR)

(73) Assignee: Micron Technology, Inc., Boise, ID (US)

( * ) Notice: Subject to any disclaimer, the term of this patent is extended or adjusted under 35 U.S.C. 154(b) by 599 days.

(21) Appl. No.: 12/154,835

(22) Filed: May 27, 2008

(65) Prior Publication Data

US 2008/0298139 A1     Dec. 4, 2008

Related U.S. Application Data

(60) Provisional application No. 60/932,223, filed on May 30, 2007.

(51) Int. Cl.
*G11C 5/14* (2006.01)
(52) U.S. Cl. ............... 365/189.09; 365/189.11; 365/206
(58) Field of Classification Search ............. 365/189.09, 365/189.11, 206
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |

(Continued)

FOREIGN PATENT DOCUMENTS

CA          272437          7/1927
(Continued)

OTHER PUBLICATIONS

"Flash Memory Cells—an Overview", Pavan et al., Proceedings of the IEEE, vol. 85, No. 8, pp. 1248-1271, Aug. 1997.

(Continued)

*Primary Examiner* — Anh Phung
*Assistant Examiner* — Hien Nguyen
(74) *Attorney, Agent, or Firm* — Wilmer Cutler Pickering Hale and Dorr, LLP

(57) ABSTRACT

A method of generating a voltage as well as an integrated circuit device (e.g., a logic device or a memory device) having a memory cell array which includes (i) a plurality of memory cells, wherein each memory cell array including (i) a plurality of memory cells, arranged in a matrix of rows and columns, and (ii) a plurality of bit lines, wherein each bit line includes a plurality of memory cells. The integrated circuit further includes voltage generation circuitry, coupled to a plurality of the bit lines, to (i) apply a first voltage to a first group of associated bit lines, and (ii) apply a second voltage to a second group of associated bit lines, and (iii) generate a third voltage by connecting the first group of associated bit lines and the second group of associated bit lines, and (iv) output the third voltage. Also, disclosed is a method of operation and/or control of such an integrated circuit device as well as such voltage generation circuitry.

23 Claims, 32 Drawing Sheets

U.S. PATENT DOCUMENTS

| | | | |
|---|---|---|---|
| 4,791,610 A | 12/1988 | Takemae | |
| 4,807,195 A | 2/1989 | Busch et al. | |
| 4,954,989 A | 9/1990 | Auberton-Herve et al. | |
| 4,979,014 A | 12/1990 | Hieda et al. | |
| 5,010,524 A | 4/1991 | Fifield et al. | |
| 5,144,390 A | 9/1992 | Matloubian | |
| 5,164,805 A | 11/1992 | Lee | |
| 5,258,635 A | 11/1993 | Nitayama et al. | |
| 5,313,432 A | 5/1994 | Lin et al. | |
| 5,315,541 A | 5/1994 | Harari et al. | |
| 5,350,938 A | 9/1994 | Matsukawa | |
| 5,355,330 A | 10/1994 | Hisamoto et al. | |
| 5,388,068 A | 2/1995 | Ghoshal et al. | |
| 5,397,726 A | 3/1995 | Bergemont et al. | |
| 5,432,730 A | 7/1995 | Shubat et al. | |
| 5,446,299 A | 8/1995 | Acovic et al. | |
| 5,448,513 A | 9/1995 | Hu et al. | |
| 5,466,625 A | 11/1995 | Hsieh et al. | |
| 5,489,792 A | 2/1996 | Hu et al. | |
| 5,506,436 A | 4/1996 | Hayashi et al. | |
| 5,512,837 A * | 4/1996 | Ohnishi | 324/704 |
| 5,515,383 A | 5/1996 | Katoozi | |
| 5,526,307 A | 6/1996 | Yiu et al. | |
| 5,528,062 A | 6/1996 | Hsieh et al. | |
| 5,568,356 A | 10/1996 | Schwartz | |
| 5,583,808 A | 12/1996 | Brahmbhatt | |
| 5,593,912 A | 1/1997 | Rajeevakumar | |
| 5,606,188 A | 2/1997 | Bronner et al. | |
| 5,608,250 A | 3/1997 | Kalnitsky | |
| 5,627,092 A | 5/1997 | Alsmeier et al. | |
| 5,631,186 A | 5/1997 | Park et al. | |
| 5,677,867 A | 10/1997 | Hazani | |
| 5,696,718 A | 12/1997 | Hartmann | |
| 5,740,099 A | 4/1998 | Tanigawa | |
| 5,754,469 A | 5/1998 | Hung et al. | |
| 5,774,411 A | 6/1998 | Hsieh et al. | |
| 5,778,243 A | 7/1998 | Aipperspach et al. | |
| 5,780,906 A | 7/1998 | Wu et al. | |
| 5,784,311 A | 7/1998 | Assaderaghi et al. | |
| 5,798,968 A | 8/1998 | Lee et al. | |
| 5,811,283 A | 9/1998 | Sun | |
| 5,847,411 A | 12/1998 | Morii | |
| 5,877,978 A | 3/1999 | Morishita et al. | |
| 5,886,376 A | 3/1999 | Acovic et al. | |
| 5,886,385 A | 3/1999 | Arisumi et al. | |
| 5,897,351 A | 4/1999 | Forbes | |
| 5,929,479 A | 7/1999 | Oyama | |
| 5,930,648 A | 7/1999 | Yang | |
| 5,936,265 A | 8/1999 | Koga | |
| 5,939,745 A | 8/1999 | Park et al. | |
| 5,943,258 A | 8/1999 | Houston et al. | |
| 5,943,581 A | 8/1999 | Lu et al. | |
| 5,960,265 A | 9/1999 | Acovic et al. | |
| 5,968,840 A | 10/1999 | Park et al. | |
| 5,977,578 A | 11/1999 | Tang | |
| 5,982,003 A | 11/1999 | Hu et al. | |
| 5,986,914 A | 11/1999 | McClure | |
| 6,018,172 A | 1/2000 | Hidada et al. | |
| 6,048,756 A | 4/2000 | Lee et al. | |
| 6,081,443 A | 6/2000 | Morishita | |
| 6,096,598 A | 8/2000 | Furukawa et al. | |
| 6,097,056 A | 8/2000 | Hsu et al. | |
| 6,097,624 A | 8/2000 | Chung et al. | |
| 6,111,778 A | 8/2000 | MacDonald et al. | |
| 6,121,077 A | 9/2000 | Hu et al. | |
| 6,133,597 A | 10/2000 | Li et al. | |
| 6,157,216 A | 12/2000 | Lattimore et al. | |
| 6,171,923 B1 | 1/2001 | Chi et al. | |
| 6,177,300 B1 | 1/2001 | Houston et al. | |
| 6,177,698 B1 | 1/2001 | Gruening et al. | |
| 6,177,708 B1 | 1/2001 | Kuang et al. | |
| 6,214,694 B1 | 4/2001 | Leobandung et al. | |
| 6,222,217 B1 | 4/2001 | Kunikiyo | |
| 6,225,158 B1 | 5/2001 | Furukawa et al. | |
| 6,245,613 B1 | 6/2001 | Hsu et al. | |
| 6,252,281 B1 | 6/2001 | Yamamoto et al. | |
| 6,262,935 B1 | 7/2001 | Parris et al. | |
| 6,292,424 B1 | 9/2001 | Ohsawa | |
| 6,297,090 B1 | 10/2001 | Kim | |
| 6,300,649 B1 | 10/2001 | Hu et al. | |
| 6,320,227 B1 | 11/2001 | Lee et al. | |
| 6,333,532 B1 | 12/2001 | Davari et al. | |
| 6,333,866 B1 | 12/2001 | Ogata | |
| 6,350,653 B1 | 2/2002 | Adkisson et al. | |
| 6,351,426 B1 | 2/2002 | Ohsawa | |
| 6,359,802 B1 | 3/2002 | Lu et al. | |
| 6,384,445 B1 | 5/2002 | Hidaka et al. | |
| 6,385,107 B1 * | 5/2002 | Bedarida et al. | 365/206 |
| 6,391,658 B1 | 5/2002 | Gates et al. | |
| 6,403,435 B1 | 6/2002 | Kang et al. | |
| 6,421,269 B1 | 7/2002 | Somasekhar et al. | |
| 6,424,011 B1 | 7/2002 | Assaderaghi et al. | |
| 6,424,016 B1 | 7/2002 | Houston | |
| 6,429,477 B1 | 8/2002 | Mandelman et al. | |
| 6,432,769 B1 | 8/2002 | Fukuda et al. | |
| 6,440,872 B1 | 8/2002 | Mandelman et al. | |
| 6,441,435 B1 | 8/2002 | Chan | |
| 6,441,436 B1 | 8/2002 | Wu et al. | |
| 6,466,511 B2 | 10/2002 | Fujita et al. | |
| 6,479,862 B1 | 11/2002 | King et al. | |
| 6,480,407 B1 | 11/2002 | Keeth | |
| 6,492,211 B1 | 12/2002 | Divakaruni et al. | |
| 6,518,105 B1 | 2/2003 | Yang et al. | |
| 6,531,754 B1 | 3/2003 | Nagano et al. | |
| 6,537,871 B2 | 3/2003 | Forbes et al. | |
| 6,538,916 B2 | 3/2003 | Ohsawa | |
| 6,544,837 B1 | 4/2003 | Divakaruni et al. | |
| 6,548,848 B2 | 4/2003 | Horiguchi et al. | |
| 6,549,450 B1 | 4/2003 | Hsu et al. | |
| 6,552,398 B2 | 4/2003 | Hsu et al. | |
| 6,552,932 B1 | 4/2003 | Cernea | |
| 6,556,477 B2 | 4/2003 | Hsu et al. | |
| 6,560,142 B1 | 5/2003 | Ando | |
| 6,563,733 B2 | 5/2003 | Liu et al. | |
| 6,566,177 B1 | 5/2003 | Radens et al. | |
| 6,567,330 B2 | 5/2003 | Fujita et al. | |
| 6,573,566 B2 | 6/2003 | Ker et al. | |
| 6,574,135 B1 | 6/2003 | Komatsuzaki | |
| 6,590,258 B2 | 7/2003 | Divakauni et al. | |
| 6,590,259 B2 | 7/2003 | Adkisson et al. | |
| 6,617,651 B2 | 9/2003 | Ohsawa | |
| 6,621,725 B2 | 9/2003 | Ohsawa | |
| 6,632,723 B2 | 10/2003 | Watanabe et al. | |
| 6,650,565 B1 | 11/2003 | Ohsawa | |
| 6,653,175 B1 | 11/2003 | Nemati et al. | |
| 6,686,624 B2 | 2/2004 | Hsu | |
| 6,703,673 B2 | 3/2004 | Houston | |
| 6,707,118 B2 | 3/2004 | Muljono et al. | |
| 6,714,436 B1 | 3/2004 | Burnett et al. | |
| 6,721,222 B2 | 4/2004 | Somasekhar et al. | |
| 6,825,524 B1 | 11/2004 | Ikehashi et al. | |
| 6,861,689 B2 | 3/2005 | Burnett | |
| 6,870,225 B2 | 3/2005 | Bryant et al. | |
| 6,882,566 B2 | 4/2005 | Nejad et al. | |
| 6,888,770 B2 | 5/2005 | Ikehashi | |
| 6,894,913 B2 | 5/2005 | Yamauchi | |
| 6,897,098 B2 | 5/2005 | Hareland et al. | |
| 6,903,984 B1 | 6/2005 | Tang et al. | |
| 6,909,151 B2 | 6/2005 | Hareland et al. | |
| 6,912,150 B2 | 6/2005 | Portman et al. | |
| 6,913,964 B2 | 7/2005 | Hsu | |
| 6,936,508 B2 | 8/2005 | Visokay et al. | |
| 6,969,662 B2 | 11/2005 | Fazan et al. | |
| 6,975,536 B2 | 12/2005 | Maayan et al. | |
| 6,982,902 B2 | 1/2006 | Gogl et al. | |
| 6,987,041 B2 | 1/2006 | Ohkawa | |
| 7,030,436 B2 | 4/2006 | Forbes | |
| 7,037,790 B2 | 5/2006 | Chang et al. | |
| 7,041,538 B2 | 5/2006 | Ieong et al. | |
| 7,042,765 B2 | 5/2006 | Sibigtroth et al. | |
| 7,061,806 B2 | 6/2006 | Tang et al. | |
| 7,085,153 B2 | 8/2006 | Ferrant et al. | |
| 7,085,156 B2 | 8/2006 | Ferrant et al. | |
| 7,170,807 B2 | 1/2007 | Fazan et al. | |
| 7,177,175 B2 | 2/2007 | Fazan et al. | |
| 7,187,581 B2 | 3/2007 | Ferrant et al. | |
| 7,230,846 B2 | 6/2007 | Keshavarzi | |

| | | |
|---|---|---|
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee et al. |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0049486 A1 | 2/2008 | Gruening-von Schwerin |
| 2008/0055991 A1* | 3/2008 | Kim et al. ............ 365/185.11 |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |

| | | |
|---|---|---|
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto et al., A Configurable Enhanced T2RAM Macro for System-Level Power Management Unified Memory, 2006, VLSI Symposium.

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-Box for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06, International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multi-functional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, Same.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages)

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, Vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI Flash Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces, Responsible for Junction Leakage, ICSI, May 19, 2009.

Lončar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.

Lu et al., A Novel Two- Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1T Bulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMÒ Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid -State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body SOI Mosfets by the Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp
Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562μm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM(T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI Dram with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less DRAM Memory, SOI Conference, 2009 IEEE International, Oct. 5-8, 2009 pp. 1-2.
Roy, Thyristor-Based Volatile Memory in Nano-Scale CMOS, 2006, ISSCC.
Salling et al., Reliability of Thyristor Based Memory Cells, 2009, IRPS.
Sasaki et al., Charge Pumping in SOS-MOS Transistors, 1981, IEEE Trans. On El. Dev.
Sasaki et al., Charge Pumping SOS-MOS Transistor Memory, 1978, IEDM.
Schloesser et al., " A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. On El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VISI Symposium.
Sim et al., "Source-Bias Dependent Charge Accumulation in P+ -Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.
Tanaka et al., "Scalability Study on a Capacitorless 1T-DRAM: From Single-gate PD-SOI to Double-gate FINDRAM", 2004 IEEE, 4 pages.
Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15µm SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.
Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, 2005, IEEE Trans. On El. Dev.
Wang et al., A Novel 4.5F2 Capacitorless Semiconductor Memory Device, 2008, IEEE EDL.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.
Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.
Yamanaka et al., "Advanced TFT SRAM Cell Technology Using a Phase-Shift Lithography", IEEE Transactions on Electron Devices, vol. 42, No. 7, Jul. 1995, pp. 1305-1313.
Yamauchi et al., "High-Performance Embedded SOI DRAM Architecture for the Low-Power Supply", IEEE Journal of Solid-State Circuits, vol. 35, No. 8, Aug. 2000, pp. 1169-1178.
Yamawaki, M., "Embedded DRAM Process Technology", Proceedings of the Symposium on Semiconductors and Integrated Circuits Technology, 1998, vol. 55, pp. 38-43.
Yang, Optimization of Nanoscale Thyristors on SOI for High-Performance High-Density Memories, 2006, SOI Conference.
Yoshida et al., "A Design of a Capacitorless 1-T-DRAM Cell Using Gate-induced Drain Leakage (GIDL) Current for Low-Power and High-speed Embedded Memory", 2003 IEEE, 4 pages.
Yoshida et al., "A Study of High Scalable DG-FinDRAM", IEEE Electron Device Letters, vol. 26, No. 9, Sep. 2005, pp. 655-657.
Yoshida et al., A Capacitorless 1T-DRAM Technology Using GIDL Current for Low Power and High Speed Embedded Memory, 2006, IEEE Trans. On El. Dev.
Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.
Yu et al., "Hot-Carrier-Induced Degradation in Ultra-Thin-Film Fully-Depleted SOI MOSFETs", Solid-State Electronics, vol. 39, No. 12, 1996, pp. 1791-1794.
Yu et al., "Interface Characterization of Fully-Depleted SOI MOSFET by a Subthreshold I-V Method", Proceedings 1994 IEEE International SOI Conference, Oct. 1994, pp. 63-64.
Yun et al., Analysis of Sensing Margin in SOONO Device for the Capacitor-less RAM Applications, 2007, SOI Conference.
Zhou, Physical Insights on BJT-Based 1T DRAM cells, IEEE Electron Device Letters, vol. 30, No. 5, May 2009.

* cited by examiner

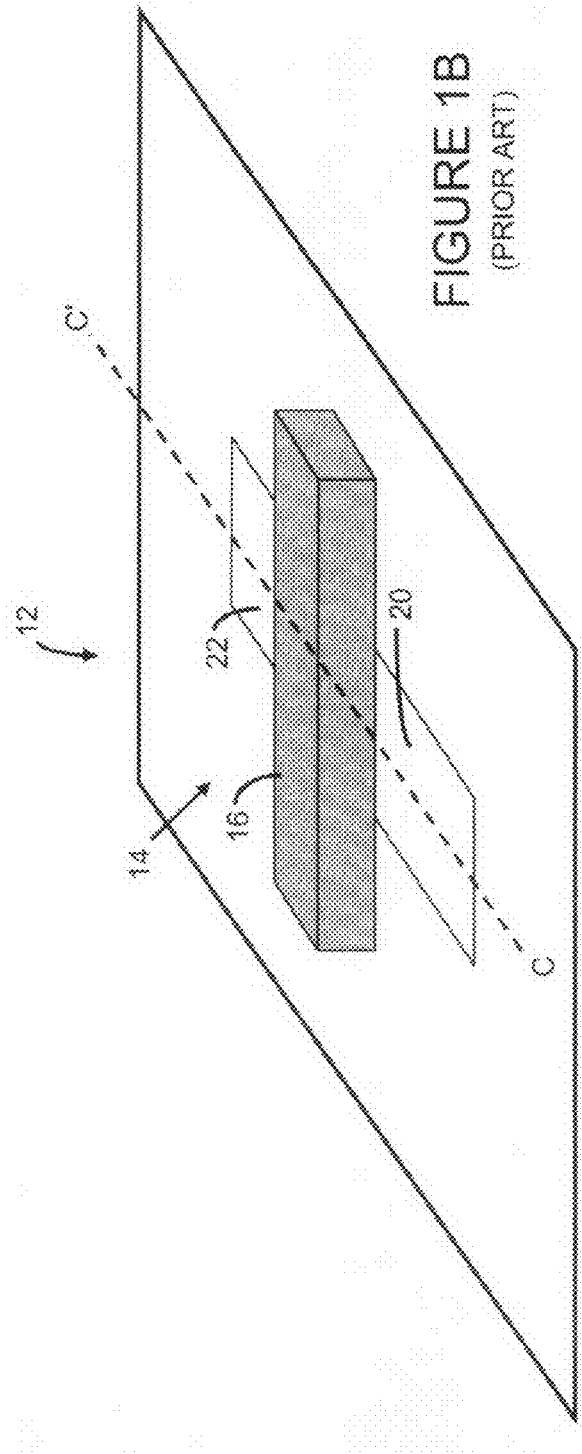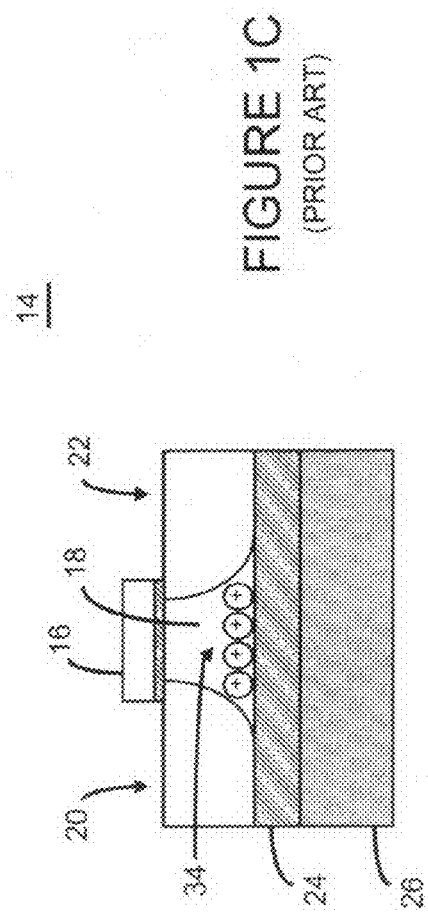
FIGURE 1B (PRIOR ART)
FIGURE 1C (PRIOR ART)

INTEGRATED CIRCUIT HAVING VOLTAGE GENERATION CIRCUITRY FOR MEMORY CELL ARRAY, AND METHOD OF OPERATING AND/OR CONTROLLING SAME

RELATED APPLICATION

This application claims priority to U.S. Provisional Application Ser. No. 60/932,223, entitled "Integrated Circuit Having Voltage Generation Circuitry for Memory Cell Array, and Method of Operating and/or Controlling Same", filed May 30, 2007; the contents of this provisional application are incorporated by reference herein in their entirety.

INTRODUCTION

The present inventions relate to a memory cell, array, architecture and device, and techniques for reading, controlling and/or operating such cell and device; and more particularly, in one aspect, to a semiconductor dynamic random access memory ("DRAM") cell, array, architecture and/or device wherein the memory cell includes a transistor having an electrically floating body in which an electrical charge is stored.

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and Fin-FET.

One type of dynamic random access memory cell is based on, among other things, the electrically floating body effect of SOI transistors. (See, for example, U.S. Pat. No. 6,969,662, incorporated herein by reference). In this regard, the dynamic random access memory cell may consist of a PD or a FD SOI transistor (or transistor formed in bulk material/substrate) having a channel, which is interposed between the body and the gate dielectric. The body region of the transistor is electrically floating in view of the insulation layer (or non-conductive region, for example, in a bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bitline(s) 32. In response, charge carriers are accumulated in or emitted and/or ejected from electrically floating body region 18 wherein the data states are defined by the amount of carriers within electrically floating body region 18. Notably, the entire contents of the '662 patent, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 34 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carriers in the body region relative to an unprogrammed device and/or a device that is programmed with a logic low or State "0". In contrast, a logic low or State "0" corresponds to a reduced concentration of majority carriers in the body region relative to an unprogrammed device and/or a device that is programmed with logic high or State "1".

Conventional reading is performed by applying a small drain bias and a gate bias above the transistor threshold voltage. The sensed drain current is determined by the charge stored in the floating body giving a possibility to distinguish between the states "1" and "0". A floating body memory device has two different current states corresponding to the two different logical states: "1" and "0".

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines 28 to enable the reading of the memory cells associated with such word lines. The amount of drain current is determined/affected by the charge stored in the electrically floating body region of the transistor. As such, conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

In short, conventional writing programming techniques for memory cells having an N-channel type transistor often provide an excess of majority carriers by channel impact ionization (see, FIG. 3A) or by band-to-band tunneling (gate-induced drain leakage "GIDL") (see, FIG. 3B). The majority carriers may be removed via drain side hole removal (see, FIG. 4A), source side hole removal (see, FIG. 4B), or drain and source hole removal, for example, using the back gate pulsing (see, FIG. 4C).

Further, FIG. 5 illustrates the conventional reading technique. In one embodiment, the state of the memory cell may be determined by sensing the amount of the channel current provided/generated in response to the application of a predetermined voltage on the gate of the transistor of the memory cell.

The memory cell 12 having electrically floating body transistor 14 may be programmed/read using other techniques including techniques that may, for example, provide lower power consumption relative to conventional techniques. For example, memory cell 12 may be programmed, read and/or controlled using the techniques and circuitry described and illustrated in U.S. Pat. No. 7,301,803 and/or U.S. Patent Application Publication No. 2007/0058427 (U.S. Non-Provisional patent application Ser. No. 11/509,188, filed on Aug. 24, 2006, and entitled "Memory Cell and Memory Cell Array Having an Electrically Floating Body Transistor, and Methods of Operating Same"), which are incorporated by reference herein. In particular, in one aspect, U.S. Patent Application Publication No. 2007/0058427 (hereinafter "the '427 Publication") is directed to programming, reading and/or control methods which allow low power memory programming and provide larger memory programming window (both relative to at least the conventional programming techniques).

With reference to FIG. 6, in one embodiment, the '427 Publication employs memory cell 12 having electrically floating body transistor 14. The electrically floating body transistor 14, in addition to the MOS transistor, includes an intrinsic bipolar transistor (including, under certain circumstances, a significant intrinsic bipolar current). In this illustrative exemplary embodiment, electrically floating body transistor 14 is an N-channel device. As such, majority carriers are "holes".

With reference to FIG. 7, in one embodiment, the '427 Publication employs, writes or programs a logic "1" or logic high using control signals (having predetermined voltages, for example, $V_g=0V$, $V_s=0V$, and $V_d=3V$) which are applied to gate 16, source region 20 and drain region 22 (respectively) of transistor 14 of memory cell 12. Such control signals induce or cause impact ionization and/or the avalanche multiplication phenomenon. (See, FIG. 7). The predetermined voltages of the control signals, in contrast to the conventional method, program or write a logic "1" in the transistor of the memory cell via impact ionization and/or avalanche multiplication in the electrically floating body. In one embodiment, it is preferred that the bipolar transistor current responsible for impact ionization and/or avalanche multiplication in the floating body is initiated and/or induced by a control pulse which is applied to gate 16. Such a pulse may induce the channel impact ionization which increases the floating body potential and turns on the bipolar current. An advantage of the described method is that larger amount of the excess majority carriers is generated compared to other techniques.

Further, with reference to FIG. 8, when writing or programming logic "0" in transistor 14 of memory cell 12, in one embodiment of the '427 Publication, the control signals (having predetermined voltages (for example, $V_g=0.5V$, $V_s=3V$ and $V_d=0.5V$) are different and, in at least one embodiment, higher than a holding voltage (if applicable)) are applied to gate 16, source region 20 and drain region 22 (respectively) of transistor 14 of memory cell 12. Such control signals induce or provide removal of majority carriers from the electrically floating body of transistor 14. In one embodiment, the majority carriers are removed, eliminated or ejected from body region 18 through source region 20 and drain region 22. (See, FIG. 8). In this embodiment, writing or programming memory cell 12 with logic "0" may again consume lower power relative to conventional techniques.

When memory cell 12 is implemented in a memory cell array configuration, it may be advantageous to implement a "holding" operation for certain memory cells 12 when programming one or more other memory cells 12 of the memory cell array to enhance the data retention characteristics of such certain memory cells 12. The transistor 14 of memory cell 12 may be placed in a "holding" state via application of control signals (having predetermined voltages) that are applied to gate 16 and source region 20 and drain region 22 of transistor 14 of memory cell 12. In combination, such control signals provide, cause and/or induce majority carrier accumulation in an area that is close to the interface between gate dielectric 32 and electrically floating body region 18. (See, FIG. 9). In this embodiment, it may be preferable to apply a negative voltage to gate 16 where transistor 14 is an N-channel type transistor.

With reference to FIG. 10, in one embodiment of the '427 Publication, the data state of memory cell 12 may be read and/or determined by applying control signals (having predetermined voltages, for example, $V_g=-0.5V$, $V_s=3V$ and $V_d=0V$) to gate 16 and source region 20 and drain region 22 of transistor 14. Such signals, in combination, induce and/or cause the bipolar transistor current in those memory cells 12 storing a logic state "1". For those memory cells that are programmed to a logic state "0", such control signals do not induce and/or cause a considerable, substantial or sufficiently measurable bipolar transistor current in the cells programmed to "0" state. (See, the '427 Publication, which, as noted above, is incorporated by reference).

As mentioned above, the reading may be performed using positive voltages applied to word lines 28. As such, transistors 14 of device 10 are periodically pulsed between a positive gate bias, which (1) drives majority carriers (holes for N-channel transistors) away from the interface between gate insulator 32 and body region 18 of transistor 14 and (2) causes minority carriers (electrons for N-channel transistors) to flow from source region 20 and drain region 22 into a channel formed below gate 16, and the negative gate bias, which causes majority carriers (holes for N-channel transistors) to accumulate in or near the interface between gate 16 and body region 18 of transistor 14.

Notably, the illustrated/exemplary voltage levels to implement the write and read operations, with respect to the '427 Publication are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

With the aforementioned in mind, in a memory cell array it is often advantageous to bias common bitlines to different potentials depending on the desired memory operation (for example, read, write, or standby condition). Furthermore during read and write operations, it may be desired to apply a different voltage to the bitline either before or during the read or write operations. Generating signals having analog level voltages that are switched from one level to another depending on the operation presents challenges due, for example, to the amount of inherent capacitance represented by the bitlines of a certain portion of the memory cell array and the frequency of operation of the array. In short, such inherent capacitance makes it difficult to implement a local voltage generator that provides and holds the desired voltages under the typical "high" frequency operation.

Moreover, in an integrated circuit device having multiple memory cell arrays, routing of power presents issues of centrally positioning the voltage generation source. Providing "local" power generation to the individual memory cell arrays often entails disposing multiple regulators and generators throughout the device. Even in this scenario, the area required for enough filter capacitance to address the peak currents can significantly reduce array area efficiency. Furthermore, the challenge of providing consistent voltage regulation across multiple buffers can be problematic as well.

SUMMARY OF CERTAIN ASPECTS OF THE DISCLOSURE

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, certain of the present inventions are directed to an integrated circuit device comprising a memory cell array including (i) a plurality of memory cells, arranged in a matrix of rows and columns, and (ii) a plurality of bit lines, wherein each bit line includes a plurality of associated memory cells coupled thereto. The integrated circuit device may further include voltage generation circuitry, coupled to a plurality of the bit lines, to (i) apply a first voltage to a first group of associated bit lines, and (ii) apply a second voltage to a second group of associated bit lines, and (iii) generate a third voltage by connecting the first group of associated bit lines and the second group of associated bit lines, and (iv) output the third voltage.

In one embodiment, the number of bit lines in the first group of associated bit lines is the same as the number of bit lines in the second group of associated bit lines. In another embodiment, the number of bit lines in the first group of associated bit lines is different from the number of bit lines in the second group of associated bit lines. In yet another embodiment, the number of bit lines in the first or second group of associated bit lines is equal to or greater than two or five.

The voltage generation circuitry may include a switch circuitry to responsively couple and/or de-couple the voltage generation circuitry to/from the first or second group of associated bit lines. In another embodiment, the voltage generation circuitry includes:
  a first voltage generation circuit, coupled to the first group of associated bit lines, to (i) selectively apply the first voltage to the first group of associated bit lines and (ii) thereafter connect the first group of associated bit lines to a common connection point or node; and
  a second voltage generation circuit, coupled to the second group of associated bit lines, to (i) selectively apply the second voltage to the second group of associated bit lines and (ii) thereafter connect the second group of associated bit lines to the common connection point or node (which may be the output node of the voltage generation circuitry.

In one embodiment, the integrated circuit device includes a power supply circuit wherein the common connection point or node is connected to the power supply circuit. The power supply level may be set to the target value of the output of the voltage generation circuitry. Indeed, in response to connecting the first group of associated bit lines and the second group of associated bit lines, the electrical charge on the first group of associated bit lines is shared with second group of associated bit lines to generate the third voltage.

In another principal aspect, the present inventions are directed to an integrated circuit device comprises a memory cell array including (i) a plurality of memory cells, arranged in a matrix of rows and columns, and (ii) a plurality of bit lines, wherein each bit line includes a plurality of associated memory cells coupled thereto. The plurality of memory cells each includes an electrically floating body transistor including a body region which is electrically floating, and wherein each memory cell is programmable to store one of a plurality of data states including (i) a first data state representative of a first charge in the body region of the transistor, and (ii) a second data state representative of a second charge in the body region of the transistor.

The integrated circuit of this aspect further includes voltage generation circuitry, coupled to a plurality of the bit lines, to (i) concurrently (a) apply a first voltage to a first group of associated bit lines and (b) apply a second voltage to a second group of associated bit lines, and (ii) generate a third voltage by connecting the first group of associated bit lines and the second group of associated bit lines, and (iii) output the third voltage.

In one embodiment of this aspect, the number of bit lines in the first group of associated bit lines is the same as the number of bit lines in the second group of associated bit lines. In another embodiment, the number of bit lines in the first group of associated bit lines is different from the number of bit lines in the second group of associated bit lines. In yet another embodiment, the number of bit lines in the first or second group of associated bit lines is equal to or greater than two or five.

The voltage generation circuitry may include a switch circuitry to responsively couple and/or de-couple the voltage generation circuitry to/from the first or second group of associated bit lines. In another embodiment, the voltage generation circuitry includes:
  a first voltage generation circuit, coupled to the first group of associated bit lines, to (i) selectively apply the first voltage to the first group of associated bit lines and (ii) thereafter connect the first group of associated bit lines to a common connection point or node; and
  a second voltage generation circuit, coupled to the second group of associated bit lines, to (i) selectively apply the second voltage to the second group of associated bit lines and (ii) thereafter connect the second group of associated bit lines to the common connection point or node (which may be the output node of the voltage generation circuitry.

In one embodiment, the integrated circuit device includes a power supply circuit wherein the common connection point or node is connected to the power supply circuit. The power supply level may be set to the target value of the output of the voltage generation circuitry. Indeed, in response to connecting the first group of associated bit lines and the second group of associated bit lines, the electrical charge on the first group of associated bit lines is shared with second, group of associated bit lines to generate the third voltage.

In another principal aspect, the present inventions are directed to a method of generating a reference voltage on integrated circuit device having a memory cell array including (i) a plurality of memory cells, arranged in a matrix of rows and columns, and (ii) a plurality of bit lines, wherein each bit line includes a plurality of memory cells. The method comprises (a) applying a first voltage to a first group of associated bit lines, (b) applying a second voltage to a second group of associated bit lines, (c) generating a reference voltage by electrically coupling the first group of associated bit lines and the second group of associated bit lines, and (d) outputting the third voltage to circuitry on the integrated circuit device.

In one embodiment, the method may include concurrently applying a first voltage to a first group of associated bit lines and the second voltage to a second group of associated bit lines.

In one embodiment of this aspect, the number of bit lines in the first group of associated bit lines is the same as the number of bit lines in the second group of associated bit lines. In another embodiment, the number of bit lines in the first group of associated bit lines is different from the number of bit lines in the second group of associated bit lines. In yet another embodiment, the number of bit lines in the first or second group of associated bit lines is equal to or greater than two or five.

The method may further include responsively coupling and/or de-coupling the voltage generation circuitry to/from the first or second group of associated bit lines. In addition thereto, or in lieu thereof, the method may include applying the first voltage to a first group of associated bit lines and thereafter connect the first group of associated bit lines to a common connection point or node, applying the second voltage to a second group of associated bit lines and (ii) thereafter connect the second group of associated bit lines to the common connection point or node. In this embodiment, the voltage generation circuitry may include the first voltage generation circuit coupled to the first group of associated bit lines, the second voltage generation circuit coupled to the second group of associated bit lines, and the common connection point or node may be the output of the voltage generation circuitry.

Notably, in response to connecting the first group of associated bit lines and the second group of associated bit lines, an electrical charge on the first group of associated bit lines may be shared with second group of associated bit lines to generate the third voltage.

In yet another principal aspect, the present inventions are directed to an integrated circuit device comprising memory cell array including (i) a plurality of memory cells, arranged in a matrix of rows and columns, and (ii) a plurality of bit lines, wherein each bit line includes a plurality of associated memory cells coupled thereto. The integrated circuit device of this aspect includes voltage generation means for (i) applying a first voltage to a first group of associated bit lines, and (ii) applying a second voltage to a second group of associated bit lines, and (iii) generating a third voltage by connecting the first group of associated bit lines and the second group of associated bit lines, and (iv) output the third voltage.

In one embodiment of this aspect, the number of bit lines in the first group of associated bit lines is the same as the number of bit lines in the second group of associated bit lines. In another embodiment, the number of bit lines in the first group of associated bit lines is different from the number of bit lines in the second group of associated bit lines. In yet another embodiment, the number of bit lines in the first or second group of associated bit lines is equal to or greater than two or five.

The voltage generation means may include switch means for responsively coupling and/or de-coupling the voltage generation circuitry to/from the first or second group of associated bit lines. In another embodiment, the voltage generation means includes:
  first voltage generation means coupled to the first group of associated bit lines, for (i) selectively applying the first voltage to the first group of associated bit lines and (ii) thereafter connecting the first group of associated bit lines to a common connection point or node; and
  second voltage generation means, coupled to the second group of associated bit lines, for (i) selectively applying the second voltage to the second group of associated bit lines and (ii) thereafter connecting the second group of associated bit lines to the common connection point or node (which may be the output node of the voltage generation circuitry.

In one embodiment, the integrated circuit device includes power supply means wherein the common connection point or node is connected to power supply means. The power supply level may be set to the target value of the output of the voltage generation means. Indeed, in response to connecting the first group of associated bit lines and the second group of associated bit lines, the electrical charge on the first group of associated bit lines is shared with second group of associated bit lines to generate the third voltage.

Notably, the plurality of memory cells may each include an electrically floating body transistor including a body region which is electrically floating, and wherein each memory cell is programmable to store one of a plurality of data states including (i) a first data state representative of a first charge in the body region of the transistor, and (ii) a second data state representative of a second charge in the body region of the transistor.

Again, there are many inventions, and aspects of the inventions, described and illustrated herein. This Summary of the Inventions is not exhaustive of the scope of the present inventions. Indeed, this Summary of the Inventions may not be reflective of or correlate to the inventions protected by the claims in this or in continuation/divisional applications hereof.

Moreover, this Summary of the Inventions is not intended to be limiting of the inventions or the claims (whether the currently presented claims or claims of a divisional/continuation application(s)) and should not be interpreted in that manner. While certain embodiments have been described and/or outlined in this Summary of the Inventions, it should be understood that the present inventions are not limited to such embodiments, description and/or outline, nor are the claims limited in such a manner (which should also not be interpreted as being limited by the Summary of the Inventions).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed separately or in combination with one or more of the other aspects and/or embodiments thereof. For the sake of brevity, many of those permutations and combinations will not be discussed and/or illustrated separately herein.

FIG. 1B is a three dimensional view of an exemplary prior art memory cell comprised of one electrically floating body transistor (PD-SOI NMOS);

FIG. 1C is a cross-sectional view of the prior art memory cell of FIG. 1B, cross-sectioned along line C-C';

FIGS. 26A-26C are schematic block diagram illustrations of an exemplary devices in which the row redundancy architecture may be implemented wherein FIGS. 26A and 26C are logic devices (having logic circuitry and resident memory)

and FIG. 26B is a memory device (having primarily of a memory array), according to certain aspects of the present inventions.

Figure 1A:
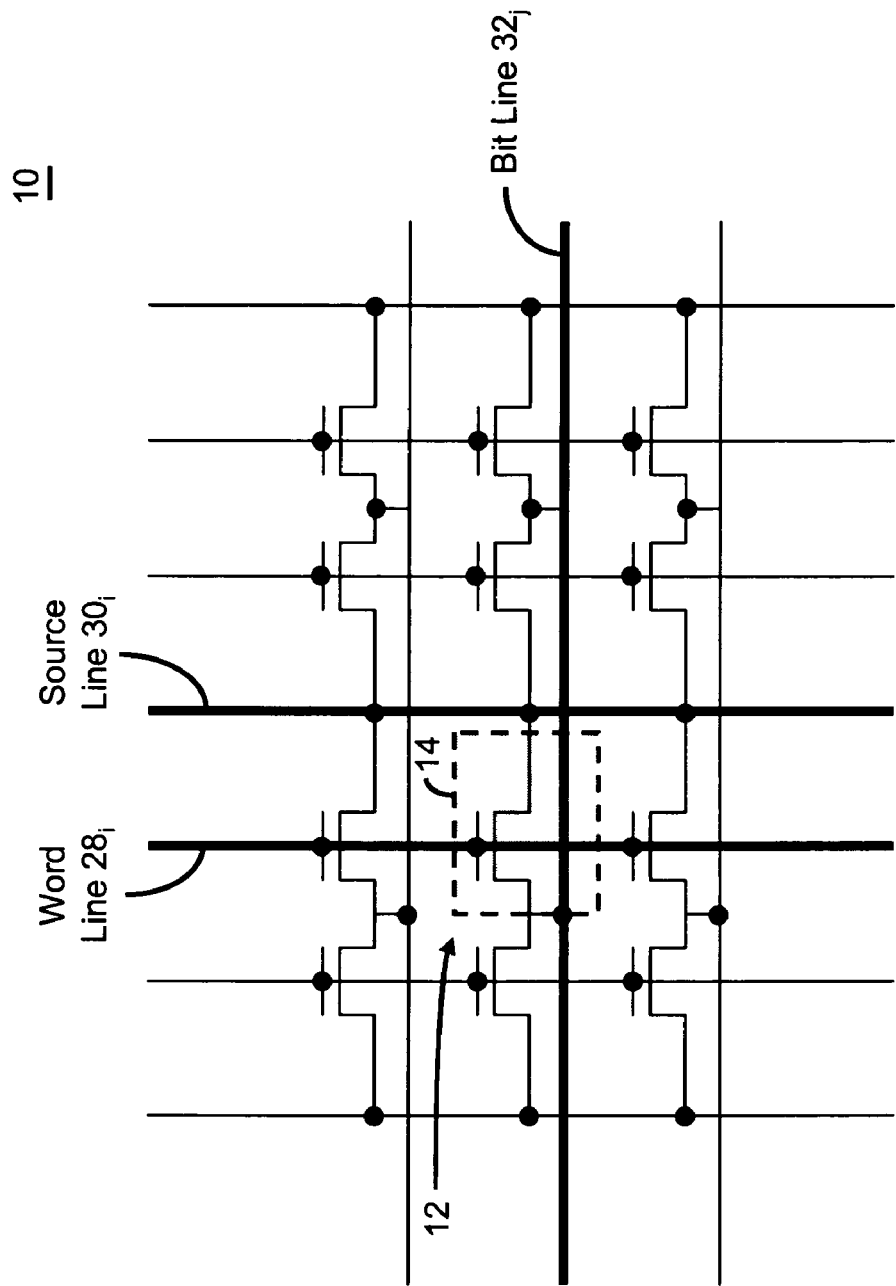
FIG. 1A is a schematic representation of a prior art DRAM array including a plurality of memory cells comprised of one electrically floating body transistor.
Figure 2A:
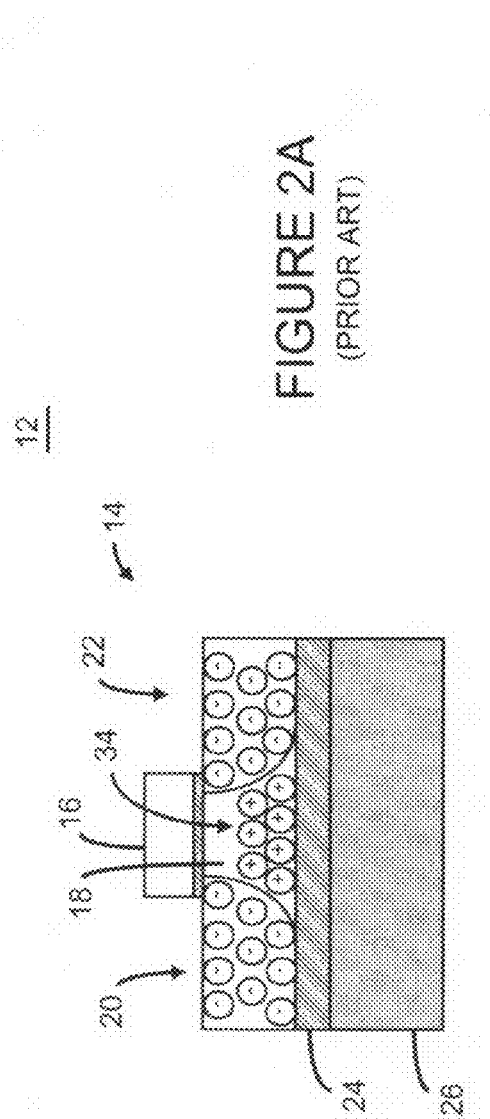
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
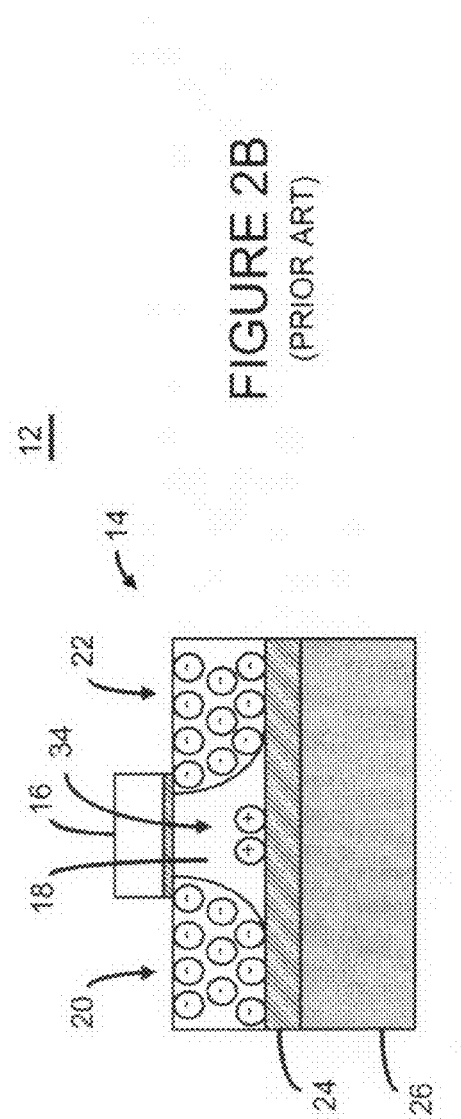
Figure 3A:
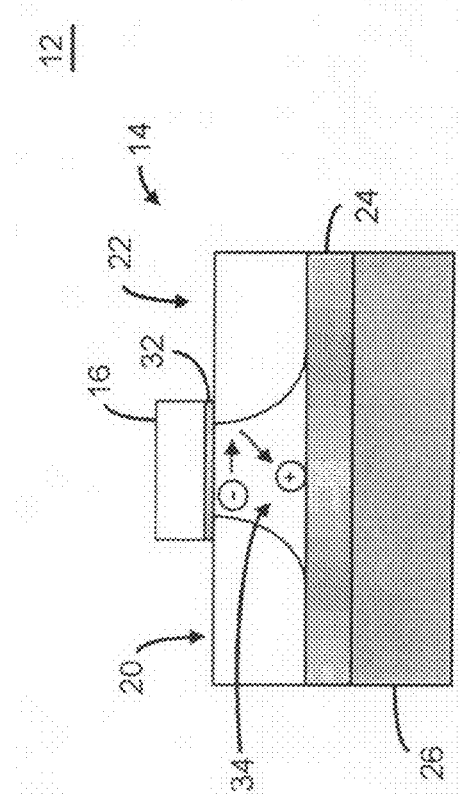
FIGS. 3A and 3B are exemplary schematic and general illustrations of conventional methods to program a memory cell to logic state "1" (i.e., generate or provide an excess of majority carrier in the electrically floating body of the transistor (an N-type channel transistor in this exemplary embodiment) of the memory cell of FIG. 1B; majority carriers in these exemplary embodiments are generated or provided by the channel electron impact ionization (FIG. 3A) and by GIDL or band to band tunneling (FIG. 3B))
Figure 3B:
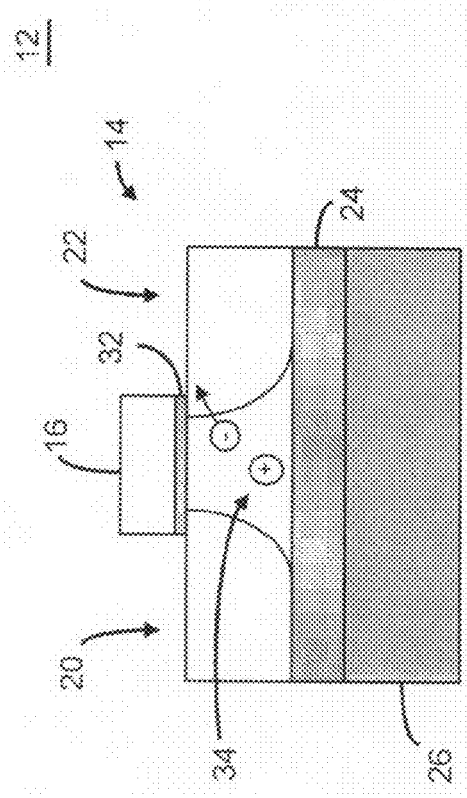
Figure 4A:
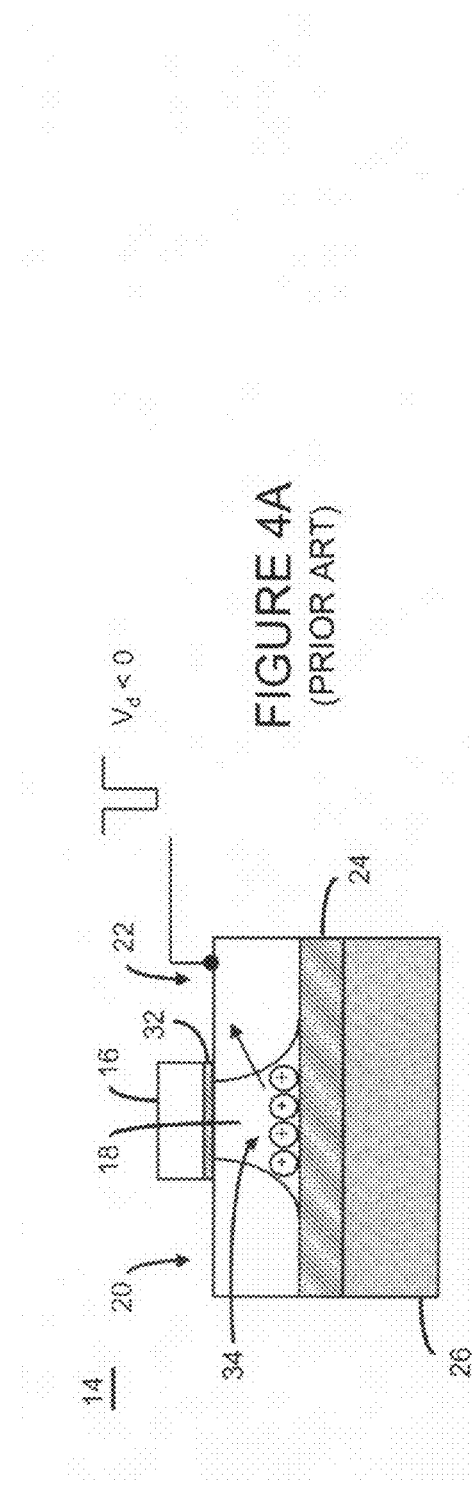
FIGS. 4A-4C are exemplary schematics and general illustrations of conventional methods to program a memory cell to logic state "0" (i.e., provide relatively fewer majority carriers by removing majority carriers from the electrically floating body of the transistor of the memory cell of FIG. 1B; majority carriers may be removed through the drain region/terminal of the transistor (FIG. 4A), the source region/terminal of the transistor (FIG. 4B), and through both drain and source regions/terminals of the transistor by using, for example, the back gate pulses applied to the substrate/backside terminal of the transistor of the memory cell (FIG. 4C))
Figure 4C:
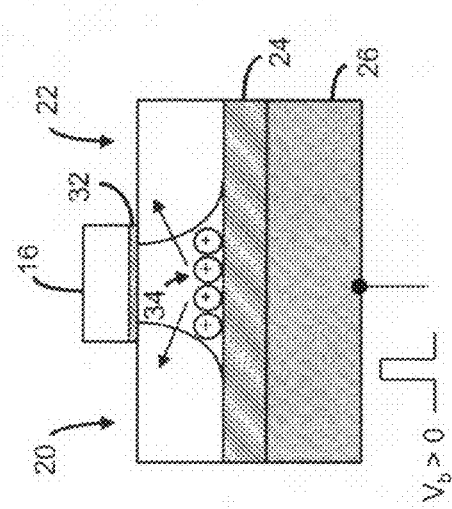
Figure 4B:
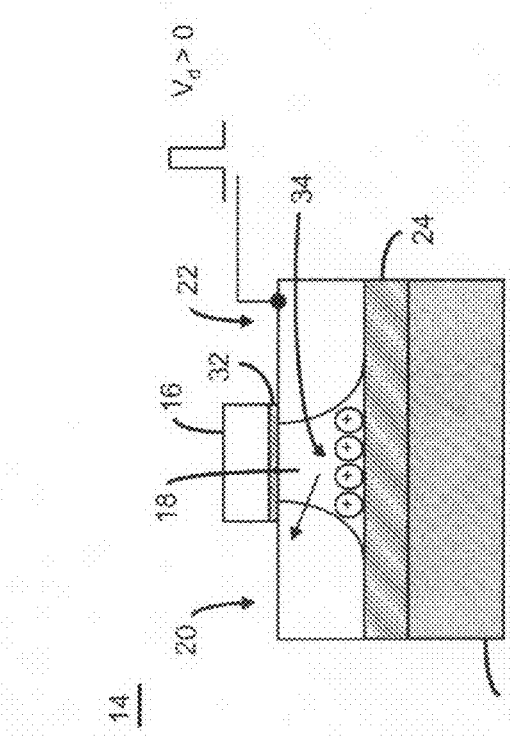
Figure 5:
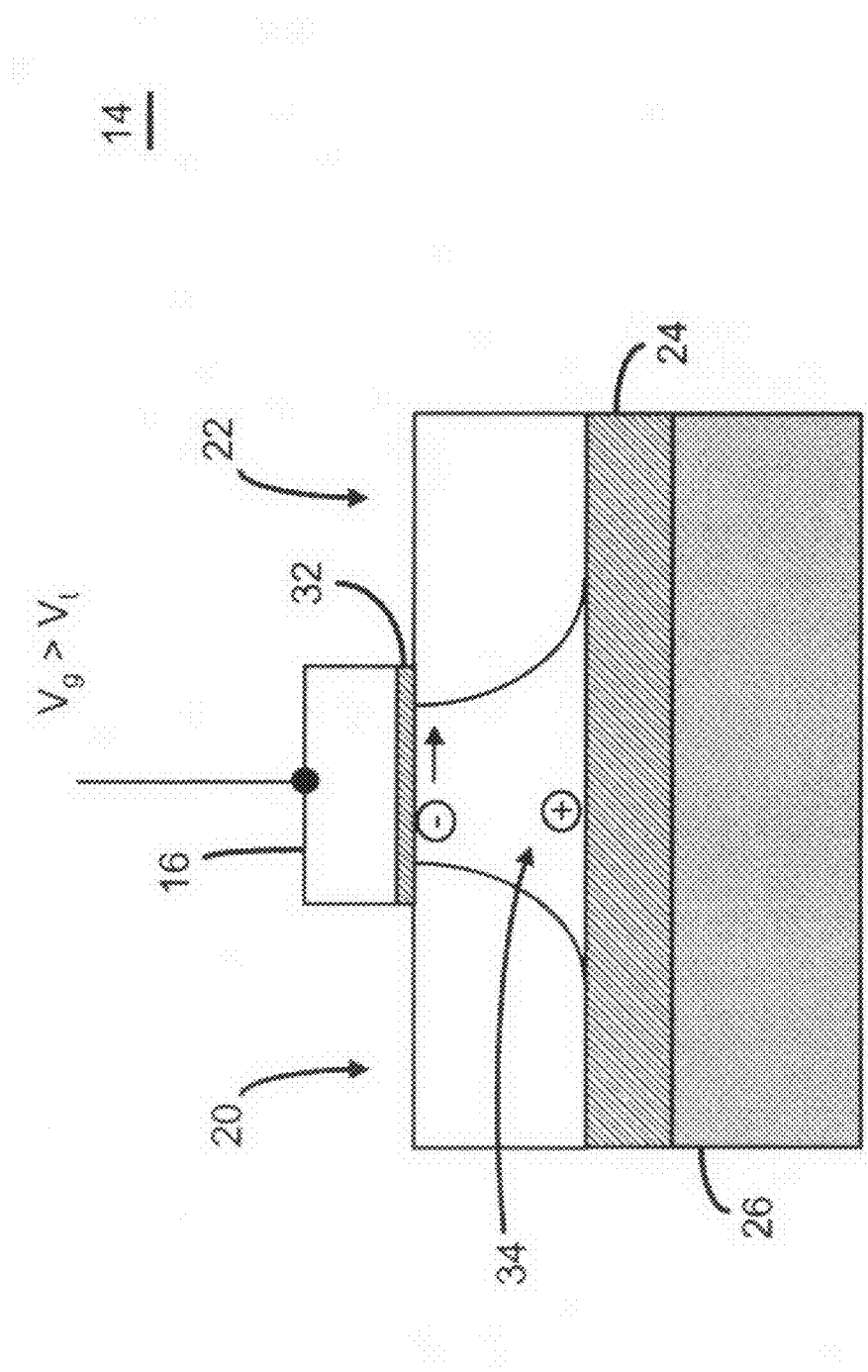
FIG. 5 illustrates an exemplary schematic (and control signal) of a conventional reading technique, the state of the memory cell may be determined by sensing the amount of the channel current provided/generated in response to the application of a predetermined voltage on the gate of the transistor of the memory cell.
Figure 6:
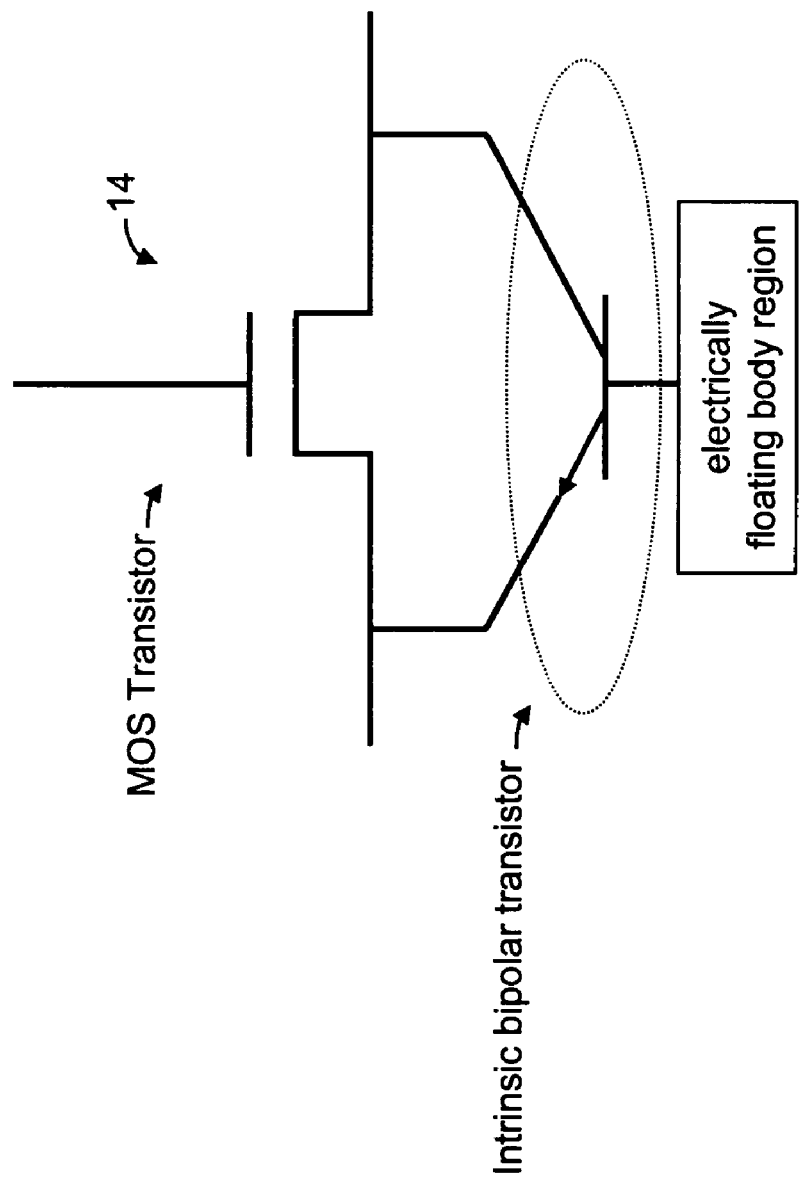
FIG. 6 is a schematic representation of an equivalent electrically floating body memory cell (N-channel type) including an intrinsic bipolar transistor in addition to the MOS transistor.
Figure 7:
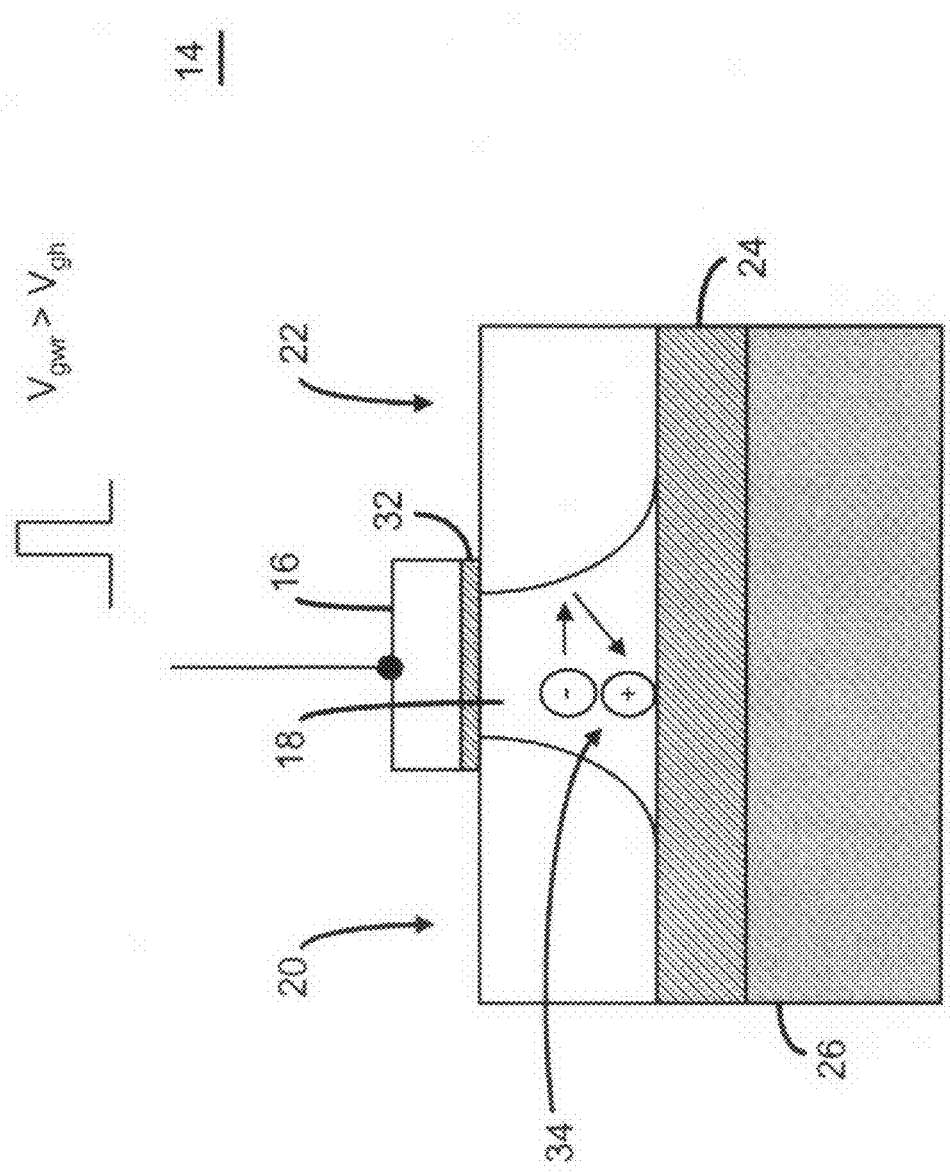
FIG. 7 illustrates an exemplary schematic (and control signal voltage relationship) of an exemplary embodiment of an aspect of the '427 Publication of programming a memory cell to logic state "1" by generating, storing and/or providing an excess of majority carriers in the electrically floating body of the transistor of the memory cell.
Figure 8:
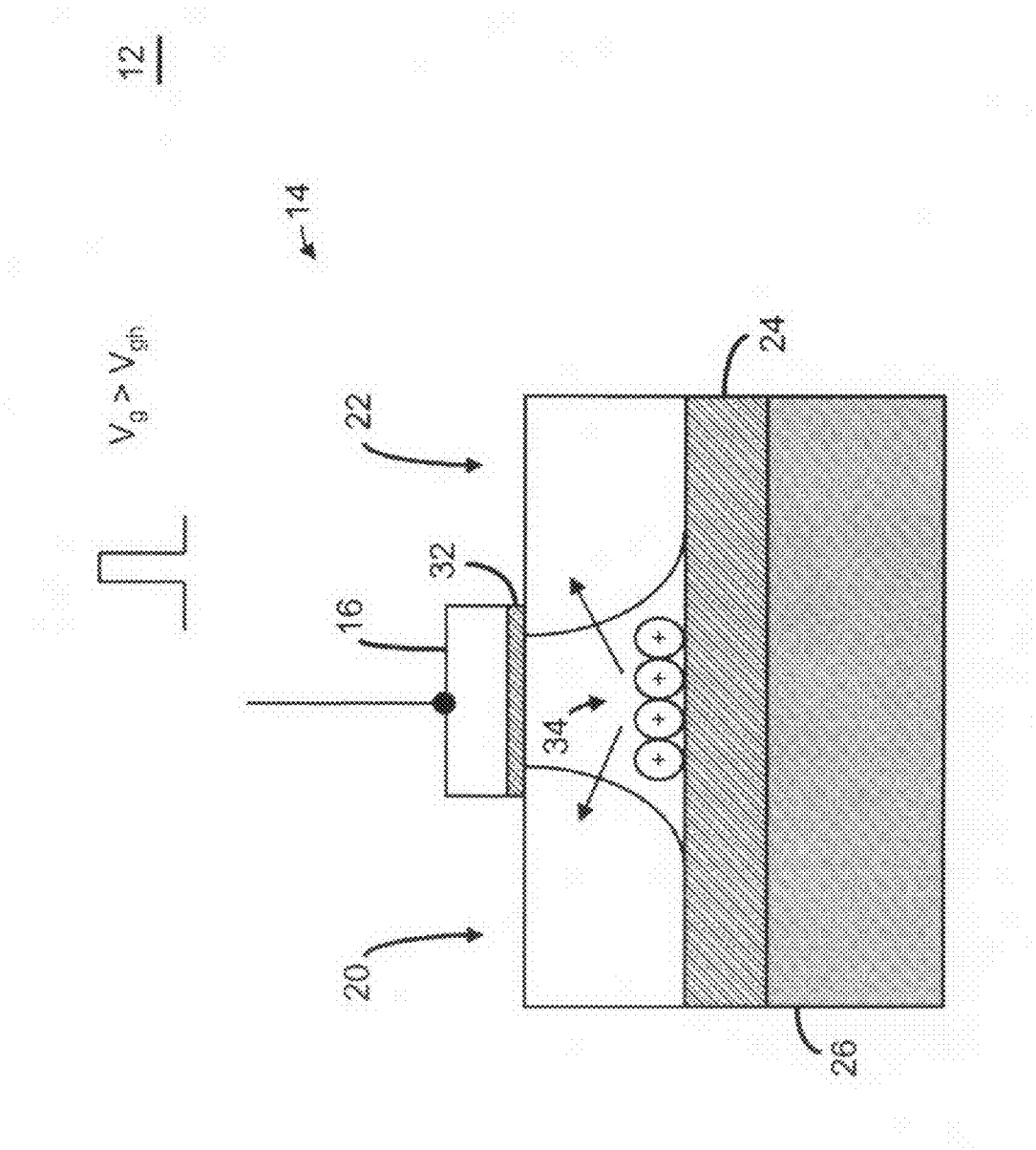
FIG. 8 illustrates an exemplary schematic (and control signals) of an exemplary embodiment of an aspect of the '427 Publication of programming a memory cell to a logic state "0" by generating, storing and/or providing relatively fewer majority carriers (as compared to the number of majority carriers in the electrically floating body of the memory cell that is programmed to a logic state "1") in the electrically floating body of the transistor of the memory cell, wherein the majority carriers are removed (write "0") through both drain and source terminals by applying a control signal (for example, a programming pulse) to the gate of the transistor of the memory cell.
Figure 9:
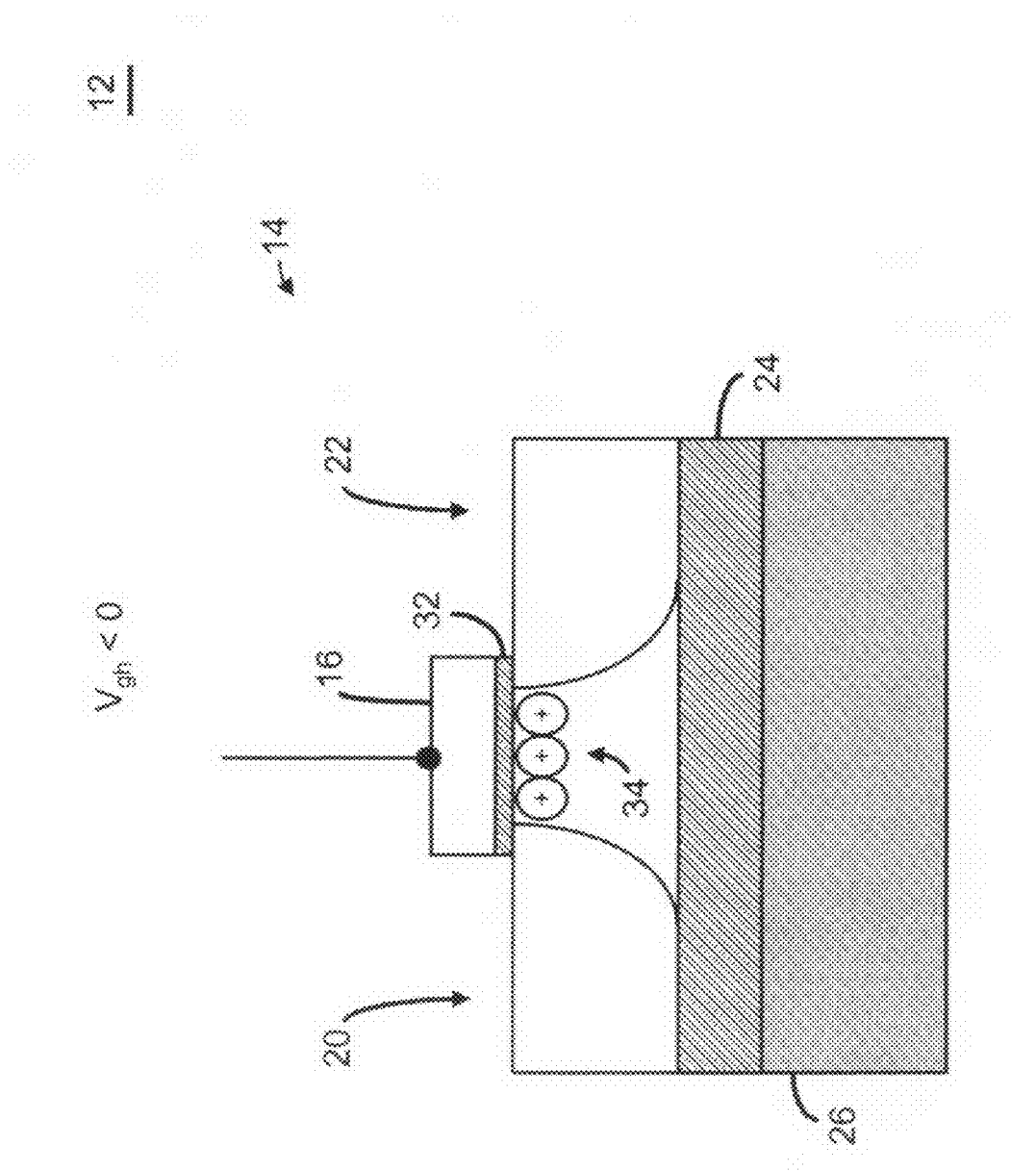
FIG. 9 illustrates an exemplary schematic (and control signals) of an exemplary embodiment of an aspect of the '427 Publication of holding or maintaining the data state of a memory cell.
Figure 10:
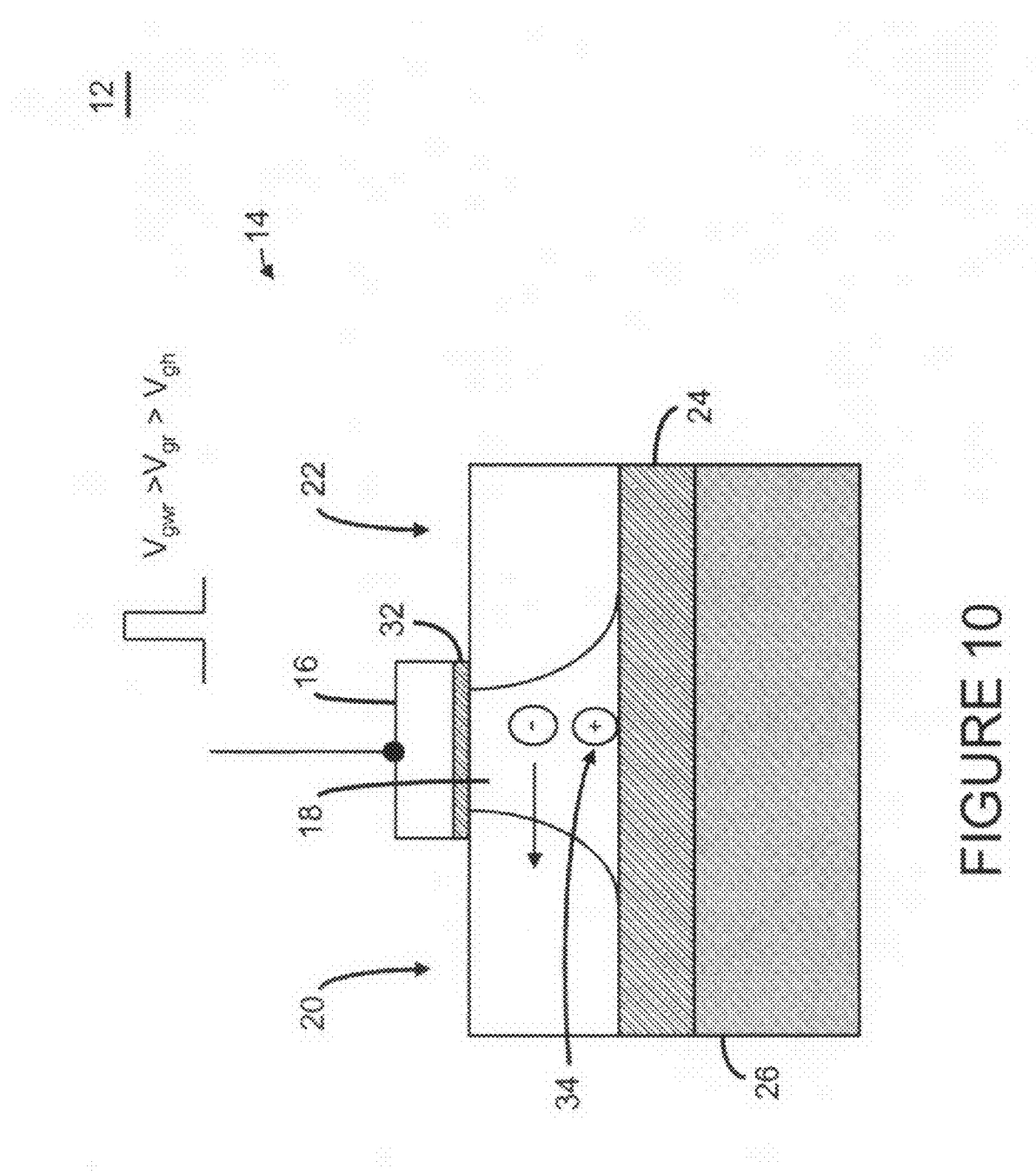
FIG. 10 illustrates an exemplary schematic (and control signals) of an exemplary embodiment of an aspect of the '427 Publication of reading the data state of a memory cell by sensing the amount of the current provided/generated in response to an application of a predetermined voltage on the gate of the transistor of the cell.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

There are many inventions described and illustrated herein. In one aspect, the present inventions are directed to voltage generation circuitry for a memory cell array having a plurality of memory cells, arranged in a matrix of rows and columns. In another aspect, the present inventions are directed to methods of programming, configuring, controlling and/or operating such voltage generation circuitry. The memory cell array and voltage generation circuitry may comprise a portion of an integrated circuit device, for example, a logic device (such as, a microcontroller or microprocessor) or a portion of a memory device (such as, a discrete memory).

In one aspect, the voltage generation circuitry implemented according to the present inventions may employ the structure and capacitance of the memory cell array to generate and/or provide one or more voltages used during one or more memory operations (for example, read, write and/or hold operations). In another aspect, the voltage generation circuitry may generate and/or provide one or more voltages used for peripheral circuitry, logic circuitry "on-chip" (i.e., on/in the integrated circuit device), if any, and/or circuitry "off-chip" (i.e., not integrated on/in the integrated circuit device). The voltage generation circuitry of the present inventions may be implemented in a local manner (i.e., using two or more bitlines of an array or sub-array) and/or in a more global manner (i.e., using all or substantially all of an array or sub-array) without the consuming a significant area of the integrated circuit. Moreover, the voltage generation circuitry may be implemented without a very low resistance power grid and may facilitate use of a common power grid across multiple arrays.

Notably, the present inventions may be implemented in conjunction with any memory cell technology, whether now known or later developed. For example, the memory cells may include one or more transistors having electrically floating body regions, one transistor-one capacitor architectures, electrically floating gate transistors, junction field effect transistors (often referred to as JFETs), or any other memory/transistor technology whether now known or later developed. All such memory technologies are intended to fall within the scope of the present inventions.

Moreover, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

In one embodiment, the memory cells of the memory cell array may include at least one transistor having an electrically floating body transistor which stores an electrical charge in the electrically floating body region thereof. The amount of charge stored in the in the electrically floating body region correlates to the data state of the memory cell. One type of such memory cell is based on, among other things, a floating body effect of semiconductor on insulator (SOI) transistors. (See, for example, (1) Fazan et al., U.S. Pat. No. 6,969,662, (2) Okhonin et al., U.S. Pat. No. 7,301,838, (3) Okhonin et al., U.S. Patent Application Publication No. 2007/0058427 ("Memory Cell and Memory Cell Array Having an Electrically Floating Body Transistor, and Methods of Operating Same"), (4) Okhonin, U.S. Patent Application Publication No. 2007/0138530, ("Electrically Floating Body Memory Cell and Array, and Method of Operating or Controlling Same"), and (5) Okhonin et al., U.S. Patent Application Publication No. 2007/0187775, ("Multi-Bit Memory Cell Having Electrically Floating Body Transistor, and Method of Programming and Reading Same"), all of which are incorporated by reference herein in its entirety). In this regard, the memory cell may consist of a partially depleted (PD) or a fully depleted (FD) SOI transistor or bulk transistor (transistor which formed in or on a bulk material/substrate) having a gate, which is disposed adjacent to the electrically floating body and separated therefrom by a gate dielectric. The body region of the transistor is electrically floating in view of the insulation or non-conductive region, for example, in bulk-type material/substrate, disposed beneath the body region. The state of memory cell may be determined by the concentration or amount of charge contained or stored in the body region of the SOI or bulk transistor.

Figure 11:
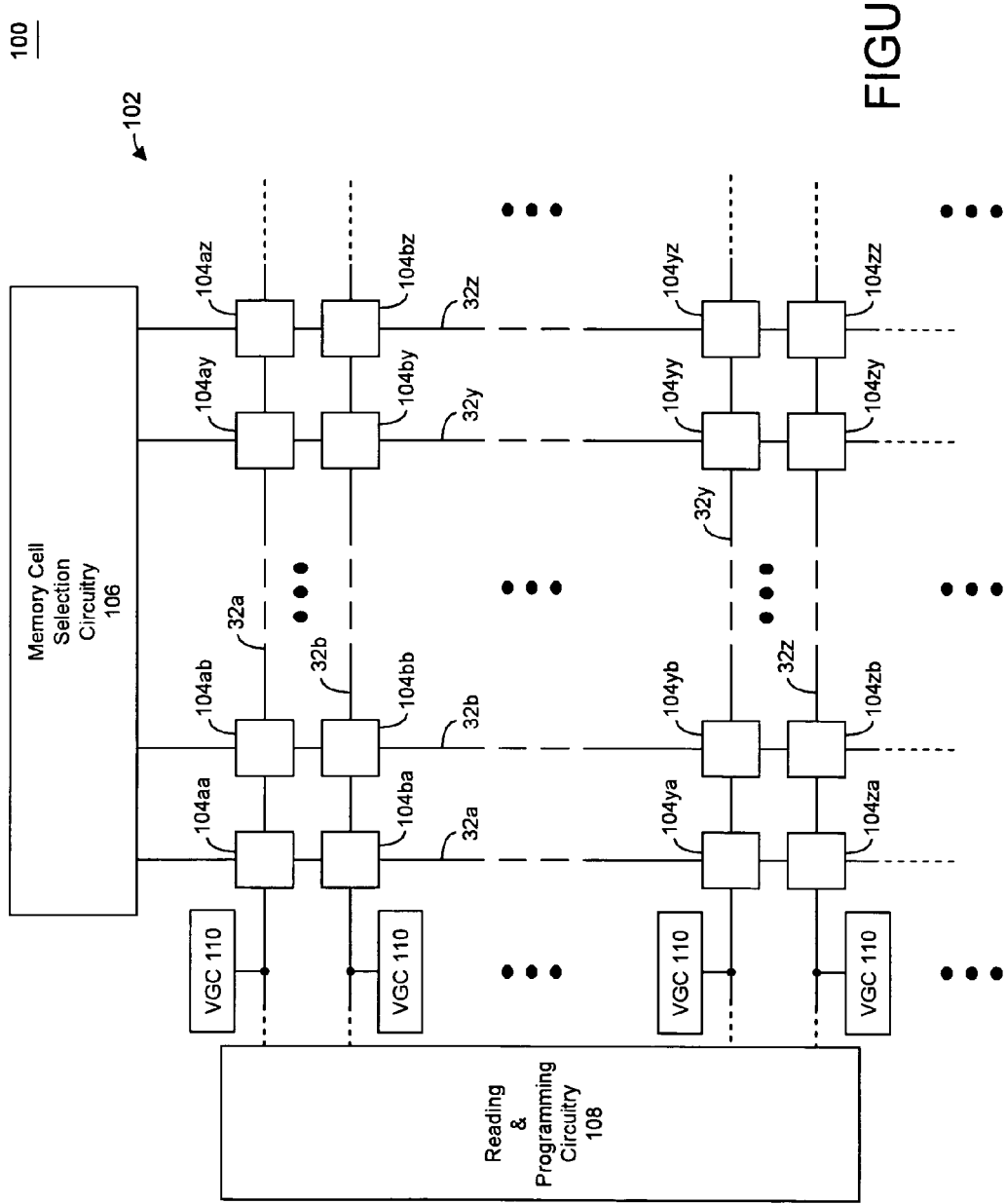
FIG. 11 illustrates an exemplary schematic block diagram of an exemplary embodiment of a memory cell array in conjunction with voltage generation circuitry coupled to an associated bitline, according to an aspect of the present inventions.

With reference to FIG. 11, in one embodiment, integrated circuit 100 for example, a logic device (such as, a microcontroller or microprocessor) or a memory device (such as, a discrete memory) includes memory cell array 102 having a plurality of memory cells 104. As noted above, in one embodiment, memory cells 104 may include at least one transistor having an electrically floating body transistor which stores an electrical charge in the electrically floating body region thereof, as discussed above. Notably, for the sake of clarity, source lines 30 (if any) are not illustrated in memory cell array 102 of FIG. 11.

The integrated circuit device 100 further includes memory cell selection circuitry 106 and reading and programming circuitry 108. Briefly, memory cell selection circuitry 106 selects or enables one or more memory cells 106 to facilitate reading data therefrom and/or writing data thereto by applying a control signal on one or more word line 28. Notably, memory cell selection circuitry 106 may be a conventional word line decoder and/or driver. There are many different control/selection techniques (and circuitry therefor) to implement the memory cell selection technique. Such techniques, and circuitry therefor, are well known to those skilled in the art. Notably, all such control/selection techniques, and circuitry therefor, which is consistent with the embodiments hereof, whether now known or later developed, are intended to fall within the scope of the present inventions.

With continued reference to FIG. 11, reading and programming circuitry 108 reads data from and writes data to selected memory cells 104. The reading and programming circuitry 108 is coupled to bitlines 32 of memory cell array 102. In one embodiment, reading and programming circuitry 108 includes a plurality of data sense amplifier (for example, a cross-coupled sense amplifier as described and illustrated in Non-Provisional U.S. patent application Ser. No. 11/299,590 (U.S. Patent Application Publication US 2006/0126374, now U.S. Pat. No. 7,301,838), filed by Waller and Carman, on Dec. 12, 2005 and entitled "Sense Amplifier Circuitry and Architecture to Write Data into and/or Read Data from Memory Cells", the application being incorporated herein by reference in its entirety) and/or U.S. Provisional Patent Application 60/967,605 (filed by Graber, on Sep. 6, 2007 and entitled "Sense Amplifier Circuitry for Integrated Circuit Having Memory Cell Array, and Method of Operating Same", the application being incorporated herein by reference in its entirety) to sense the data state stored in memory cell 104 and/or write-back data into memory cell 104. The data sense amplifier may employ voltage and/or current sensing circuitry and/or techniques. In the context of current sensing, a current sense amplifier may compare the current from the selected memory cell to a reference current, for example, the current of one or more reference cells. From that comparison, it may be determined whether memory cell 104 (which includes at least one electrically floating body transistor 14) contained a logic high (relatively more majority carries 34 contained within body region 18) or logic low data state (relatively less majority carries 28 contained within body region 18). (See, for example, FIGS. 1A-10). Notably, there are many different configurations and techniques (and circuitry therefor) to implement reading and programming circuitry 108. All such configurations and techniques, whether now known or later developed, are intended to fall within the scope of the present inventions.

Figure 12B:
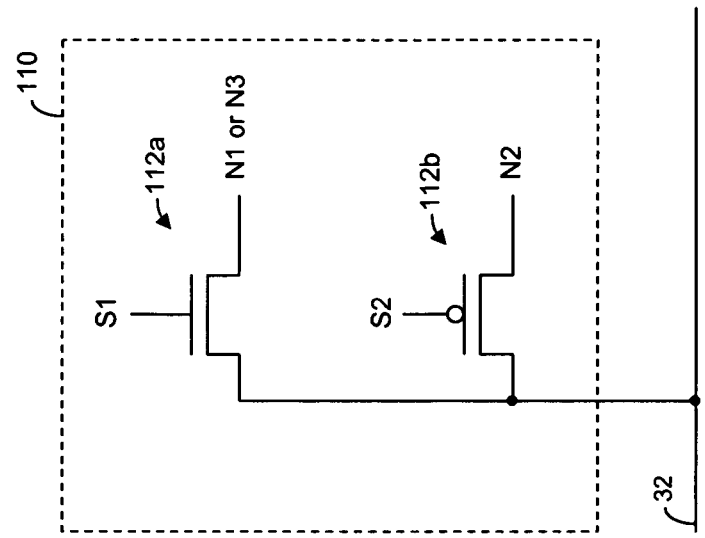
FIGS. 12A-12F illustrate exemplary schematic block diagrams of exemplary voltage generation circuitry according to certain aspects of the present inventions.
Figure 12A:
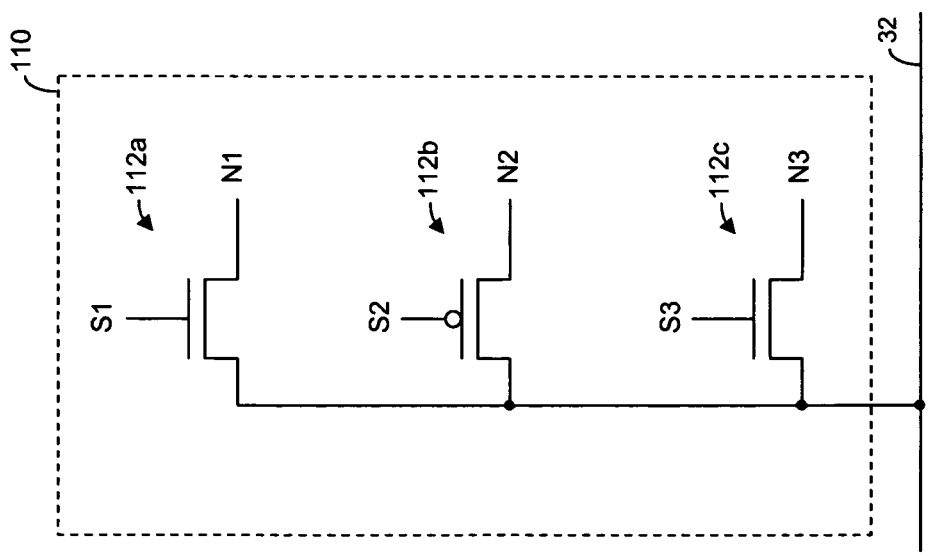
Figure 12D:
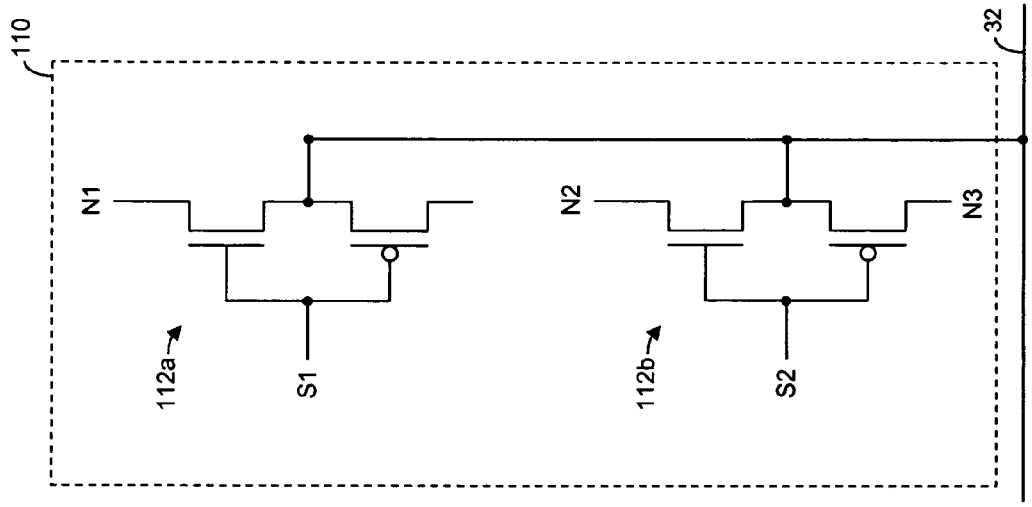
Figure 12C:
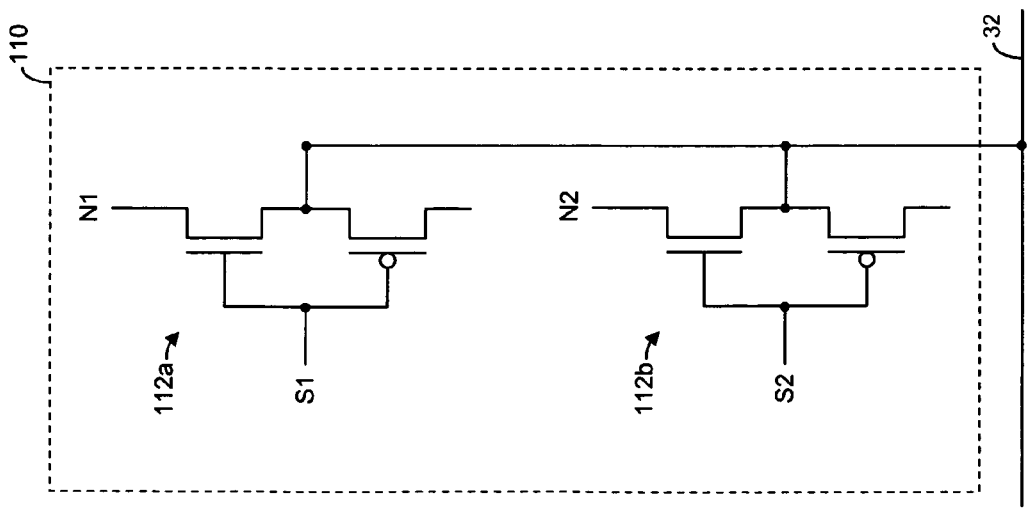

The integrated circuit device 100 further includes voltage generation circuitry 110 which generates and/or provides certain voltages for use within, for example, memory cell array 102. In this embodiment, each voltage generation circuitry 110 is coupled to an associated bitline 32 to generate and/or provide a predetermined voltage on one or more bitlines 32 (which may or may not include the associated bitline). With reference to FIGS. 12A and 12B, voltage generation circuitry 110 may include a plurality of transistors 112, each transistor 112 having a first region (source or drain) coupled to a Node N and a second region (source or drain, as the case may be) coupled to the associated bitline 32. The gate of transistor 112 is coupled to a control circuitry (for example, a decoder) to enable or disable transistor 112. In another embodiment, the plurality of transistors 112 may be configured in a CMOS arrangement. (See, for example, FIGS. 12C and 12D). The CMOS transmission gates (P channel and N channel transistors in parallel) may improve the efficiency (speed) of voltage generation circuitry 110.

Notably, the Node N1/N2/N3 may be the output of a voltage generator (not illustrated), a common connection point or node for a plurality of voltage generation circuitry 110, or a node that is at a relatively fixed voltage (during operation). For example, in the exemplary embodiments illustrated in FIGS. 12A-12D, Node N1 is a common connection point or node (for example, Vgen), Node N2 is at a relatively fixed voltage (for example, Vdd) and/or the output of circuitry (for example, a voltage generator) that provides a first voltage (for example, Vdd). In addition, in the exemplary embodiment illustrated in FIG. 12A, Node N3 may also be at a relatively fixed voltage (for example, Vss or ground) and/or the output of circuitry that provides a second voltage (for example, Vss or ground). Accordingly, in the embodiment of FIG. 12A, transistors 112 may responsively coupled or provide power, ground, or a generated supply voltage (Vgen) to the associated bitline; and in the embodiment of FIGS. 12B and 12D, transistors 112 of voltage generation circuitry 110 may responsively coupled or provide power or a generated supply voltage (Vgen) to the associated bitline.

Figure 13A:
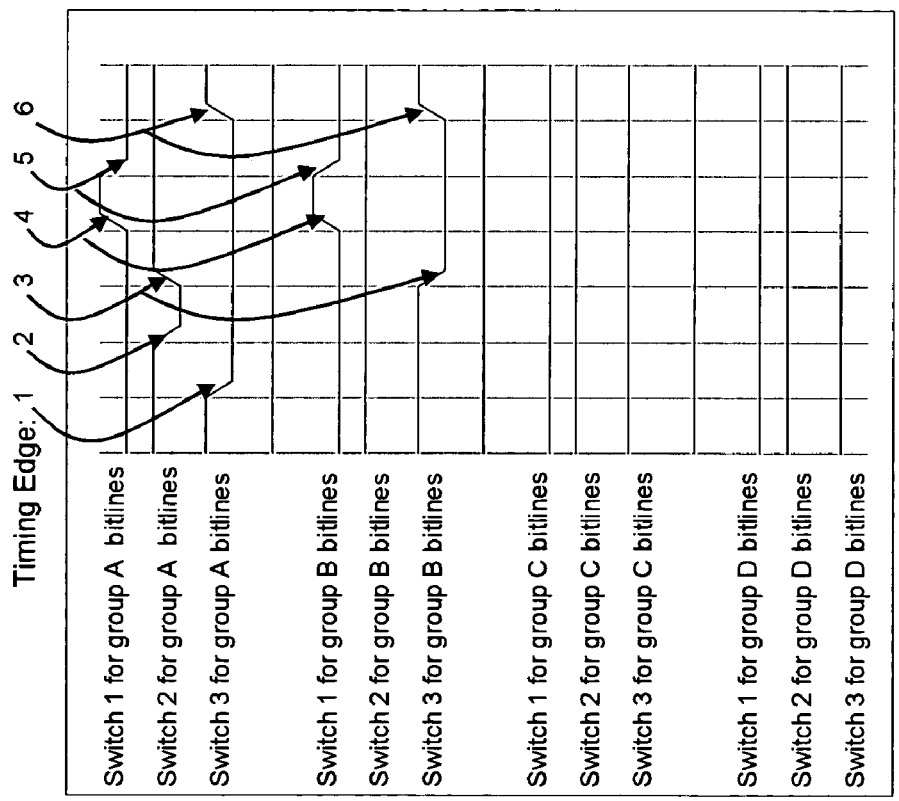
FIGS. 13A and 13B illustrate exemplary timing relationships of generating and/or providing predetermined voltages on one or more bitlines of a memory cell array.

With reference to FIGS. 11, 12A and 13A, in a first exemplary operation, a voltage that is substantially equal to one-half of the voltage of Node N2 is generated or provided locally for a selected group of bitlines 32 in memory cell array 102. In this example, the select group of bitlines may be, for example, one-half of the available bitlines (for example, 512 bitlines) of all bitlines 32 memory cell array or subarray (in this example, 1,024 bitlines). Moreover, in this example, all bitlines 32 are precharged to a voltage equal to the voltage of Node N3 (for example, ground or VSS). As such, signal S1 is low (transistor 112a is "off"), signal S2 is high (transistor 112b is "off") and S3 is high (transistor 112C is "on").

Notably, signals S1, S2 and S3 may be decoded using memory cell address data (for example, the row and/or column address data) to provide a plurality of "groups" of bitlines, for example, four "groups" of bitlines. The decoding may be done in the periphery of memory cell array 102. The decoding may employ gate control logic on-pitch (for example, in memory cell array 102) using column address data. Indeed, any circuitry and/or technique whether now known or later developed to generate and/or decode signals S1, S2 and S3 in a manner consistent with the embodiments hereof, are intended to fall within the scope of the present invention.

In this example, during the decoding operation, the selected bitlines (here, 512 bitlines) are decoded into two groups, Group A and Group B wherein Group A consists of 256 bitlines (½ of 512 bitlines) and Group 'B' also consists of 256 bitlines (the remaining ½ of 512 bitlines). Groups C and D (each having 256 bitlines), in this example, represent the unselected 512 bitlines (the remaining ½ of the 1,024 bitlines) and the voltage levels of signals S1-S3 applied to voltage generation circuitry 110 (in this example transistors 112a-112c) may remain fixed.

Notably, before and/or after generation of the voltage by voltage generation circuitry 110 certain portions of memory arrays 102 and/or sub-arrays thereof may be controlled to, for example, perform certain memory operations (for example, write, read, refresh or hold). In this regard, Groups C and D may remain static (and maintained at a certain voltage, for example, ground). However, in the event certain portions of Groups C and/or D of memory cell array 102 are performing a write operation, signal S3 may be low, followed by signal S2 being low to connect certain portions of Groups C and/or D to, for example, a write masking voltage (here, Vdd). Thus, before and/or during the generation of the voltage by voltage generation circuitry 110 and certain portions of memory arrays 102 and/or sub-arrays thereof (for example, the memory cells associated with the bitlines of Groups A and B), the voltages of the control signals applied Groups C and D (or portions thereof) may be changed and/or controlled to implement one or more memory operations. Indeed, one or more bitlines of Groups A and/or B may also undergo one or more memory operations before and/or during generation of the voltage by voltage generation circuitry 110 and the bitlines of Groups A and B.

With particular reference to FIG. 13A, in the first phase (Timing Edge 1), the bitlines of Group A are disconnected from Node N3 (here, Vss) by bringing the level of signal S3 to Vss in each voltage generation circuitry 110 associated with the bitlines of Groups A. In this way, transistors 112c of voltage generation circuitry 110 associated with the bitlines of Groups A are "off" and the bitlines of Group A are electrically floating.

In a second phase (Timing Edge 2), the bitlines of Group A are connected to Node N2 (here, Vdd) by enabling each transistor 112b of voltage generation circuitry 110 associated with the bitlines of Groups A via bringing the level of signal S2, which is applied to each such transistors 112b, to Vss. Notably, this second phase may be "combined" with the first phase; however, it may be advantageous to employ a break-before-make technique to minimize, eliminate or avoid what is commonly called as "crowbar current". Under these circumstances, the bitlines associated with Group A are driven and connected to the voltage of Node N2; and the bitlines associated with Group B are maintained at a voltage of Node N3 (here, Vss).

In a third phase (Timing Edge 3), the bitlines of Group A are disconnected from Node N2 (here, Vdd) by bringing the level of signal S2 applied to each transistor 112b of voltage generation circuitry 110 associated with the bitlines of Groups A to Vdd. In addition, the bitlines of Group B are disconnected from Node N3 (here, Vss) by bringing the level of signal S3 applied to each transistor 112b of voltage generation circuitry 110 associated with bitlines 32 of Groups A to Vss. In this way, the bitlines associated with Group A are electrically floating at Vdd and the bitlines associated with Group B are electrically floating at Vss.

Although not illustrated, the bitlines of Groups A and B may be disconnected concurrently from Node N3 (here, Vss) in the first phase by bringing the level of signal S3 to Vss applied to each voltage generation circuitry 110 associated with the bitlines of Groups A and B. Notably, in this alternative, it may be advantageous to provide suitable shielding between the bitlines 32 of Group A and Group B to minimize, prevent or eliminate any capacitive coupling between the bitlines of Group A and the bitlines of Group B.

In the fourth phase (Timing Edge 4), the bitlines of Groups A and B are connected to Node N1 by enabling (turning "on") transistor 112a via driving the signal S1, which is applied to each transistor 112a of voltage generation circuitry 110 associated with bitlines 32 of Groups A and B, to Vdd. In this way, the bitlines associated with Groups A and B are connected to Node N1 via the transistor 112a of the associated voltage generation circuitry 110. Charge sharing between the bitlines of Groups A and B will now drive and/or equalize the voltage of the bitlines of Groups A and B to Vgen, which is a common or substantially common voltage (hereinafter collectively a common voltage) of one-half of the difference between the voltage of Node N2 and voltage of Node N3. In this example, the voltage of Node N1 is one-half of (Vdd-Vss) or Vdd/2.

Figure 12F:
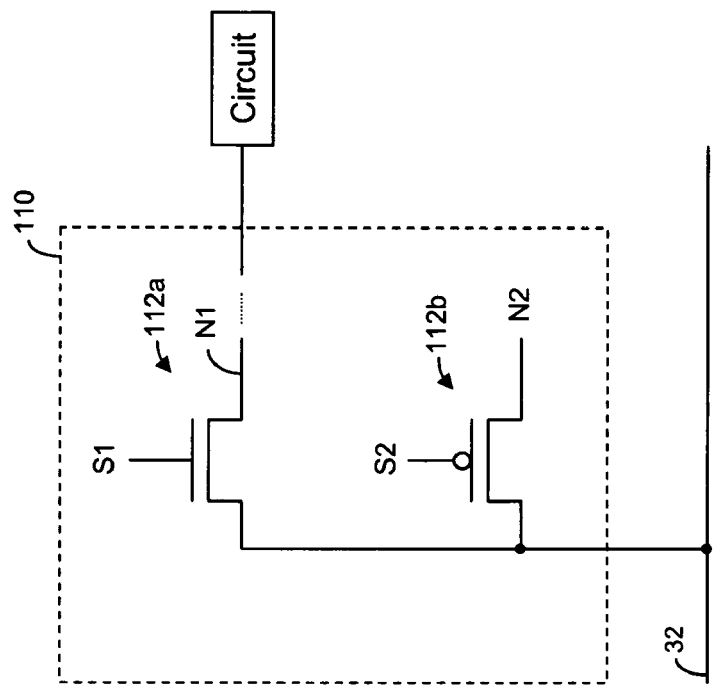
Figure 12E:
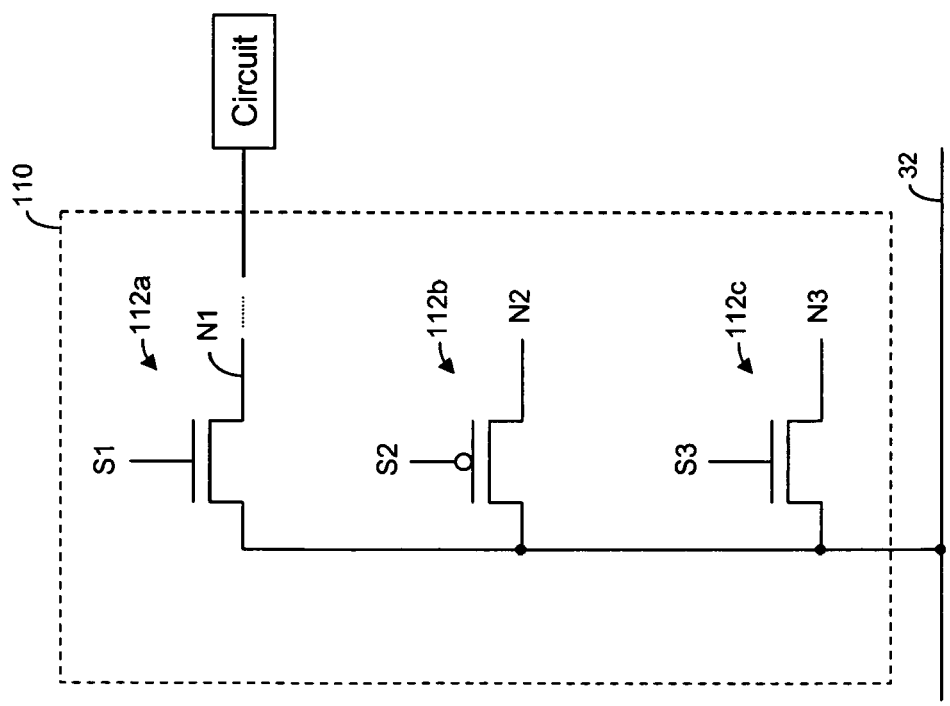

Notably, in the event that Node N1 (i.e., Vgen) is connected to the output of a circuit that provides or generates a regulated voltage, for example as a keeper voltage in the case of inactive arrays (see, for example, FIGS. 12E and 12F), the process above may reinforce the level of voltage output by the circuit. Moreover, little to no net current load should be observed or incurred by the circuit. Where the Node N1 is not connected to such a circuit (for example, a "keeper circuit") the capacitance on Node N1 may introduce some "inaccuracy" proportional to its relative capacitance to the combined group A and B bitlines and the potential difference between its starting value and that developed in the generation of a voltage Vgen that is equal to one-half of the difference between the voltage of Node N2 and voltage of Node N3 (in this example, Vdd/2).

Thereafter, the bitlines of Groups A and B may be precharged to a voltage of Node N3 by disabling transistor 112a (by driving the signal S1, which is applied to transistor 112a, to Vss) of voltage generation circuitry 110 associated with the bitlines of Groups A and B and enabling transistor 112c of such voltage generation circuitry 110. In this way, the bitlines associated with Groups A and B are precharged to a predetermined voltage and prepared for a memory operation such as a read or write operation (see, Timing Edge 6).

Thus, Timing Edge:
1. Disconnect Group A bitlines from ground precharge;
2. Connect Group A bitlines to VDD (getting ready for active cycle);
3. Electrically float Groups A and B bitlines;
4. Connect Groups A and B bitlines to Vgen (sets active level);
5. Disconnect group A and B bitlines from Vgen (preparing for precharge);
6. Precharge Groups A and B bitlines to ground or Vss (precharge achieved).

Figure 13B:
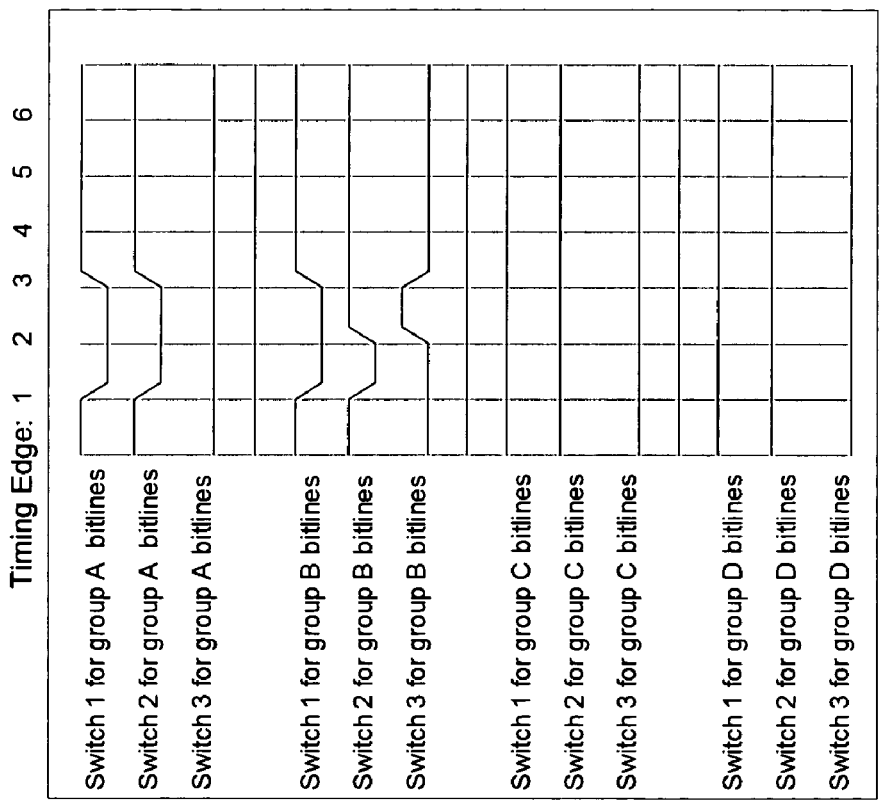

In a second exemplary operation, the precharge level of the bitlines is one-half Vdd and in the active cycle, 512 bits of a 1,024 bitlines of the array or subarray are connected to Vdd. With reference to FIG. 13B, the first phase (Timing Edge 1), transistors 112a of voltage generation circuitry 110 associated with Groups A and B are disabled (via signal S1), thereby disconnecting the bitlines associated with Groups A and B from Node N1 (which is at a voltage of Vgen), and transistors 112b of such voltage generation circuitry 110 are enabled (via signal S2), thereby connecting the bitlines associated with Groups A and B to Node N2 (which, in this example, is at a voltage of Vdd). With this operation, the Groups A and B bitlines do not participate in array operations and any desired array operation can be performed on the bitlines of Groups C and D. As such, Groups A and B are masked during the write operation and thereby are not affected by the write operation.

After the desired memory operation (for example, write, refresh, read or hold with respect to the memory cells associated with the bitlines of Groups C and D), transistors 112b of the voltage generation circuitry 110 associated with Group B are disabled, thereby disconnecting the bitlines associated with Group B from Node N2, and transistors 112c of such voltage generation circuitry 110 are enabled (via signal S3), thereby connecting the bitlines associated with Group B to Node N3 (which, in this example, is at a voltage of Vss). (See, Timing Edge 2 in FIG. 13B).

Thereafter, the bitlines associated with Groups A and B are coupled to the voltage of Node N1 (here, Vgen) by enabling transistor 112a and disabling transistors 112b and 112c of the voltage generation circuitry 110 associated with Groups A and B. (See, Timing Edges 3-4 in FIG. 13B). In this way, the bitlines associated with Group A (which were floating at the voltage of Node N3, here Vdd) and the bitlines associated with Group B (which were floating at the voltage of Node N2, here Vss) are connected to Node N1 via each transistor 112a of the associated voltage generation circuitry 110. Again, charge sharing between the bitlines of Groups A and B will drive and/or equalize the voltage of the bitlines of Groups A and B at a voltage of Node N1 (here, Vgen), which is a common or substantially common voltage (hereinafter collectively a common voltage) of one-half of the difference between the voltage of Node N2 and voltage of Node N3 (which, in this example is one half of (Vdd-Vss) or Vdd/2).

Thus, Timing Edge:
1. Disconnect Groups A and B bitlines from Vgen and connect to Vdd (Array read or write operation may be conducted for memory cells associated with bitlines of Groups C and/or D (not shown)).
2. Disconnect Group B bitlines from Vdd and connect Group B bitlines to Vss (setting precharge level)
3. Disconnect group A bitlines from Vdd, Disconnect group B bitlines from Vss and connect Groups A and B bitlines to Vgen (precharge achieved).

Notably, as discussed in more detail below, the number of bitlines that "participate" in the voltage generation operation may be changed, controlled and/or adjusted to provide other voltages, for example, one-quarter of the difference between the voltage of Node N2 and voltage of Node N3 (which, in this example, is Vdd/4). In this regard, the number of bitlines that "participate" in the generation of a voltage of Node N1 (Vgen), and how such bitlines participate determines the voltage of Vgen, may be determined to provide a desired and/or predetermined voltage. In this way, greater granularity between the voltage of Node N2 and voltage of Node N3 may be obtained.

In another embodiment, two or more bitlines may "share" a voltage generation circuitry 110. For example, with reference to FIG. 14, integrated circuit 100 includes bitline selection circuit 114 to isolate the associated bitlines (for example, bitline selection circuit 114a may responsively isolate bitlines 32a and 32b from reading and programming circuitry 108). Notably, bitline selection circuitry 114 facilitates, among other things, implementing a shared sense amplifier architecture.

The integrated circuit 100 of this embodiment also includes bitline coupling circuit 116 to interconnect the associated bitlines 32a and 32b. In this regard, interconnection of neighboring or associated bitlines 32 may facilitate "locally" generating and/or providing a voltage on the associated bitlines 32 without interconnecting a (larger) group of bitlines (for example, all, substantially all or a Group of bitlines of an array or sub-array) to a common signal or common node. Such generated voltage may be employed by the associated bitlines, employed by other bitlines or circuitry, for example, during one or more memory operations (for example, read, write and/or hold operations) and/or employed by peripheral circuitry, on-chip logic circuitry, if any, and/or "off-chip" circuitry. Notably, this embodiment may provide an advantage of minimizing, reducing and/or eliminating the capacitive loading effect on the node of the generated voltage (in the previous example, Node N1 having a voltage of Vgen).

Figure 14:
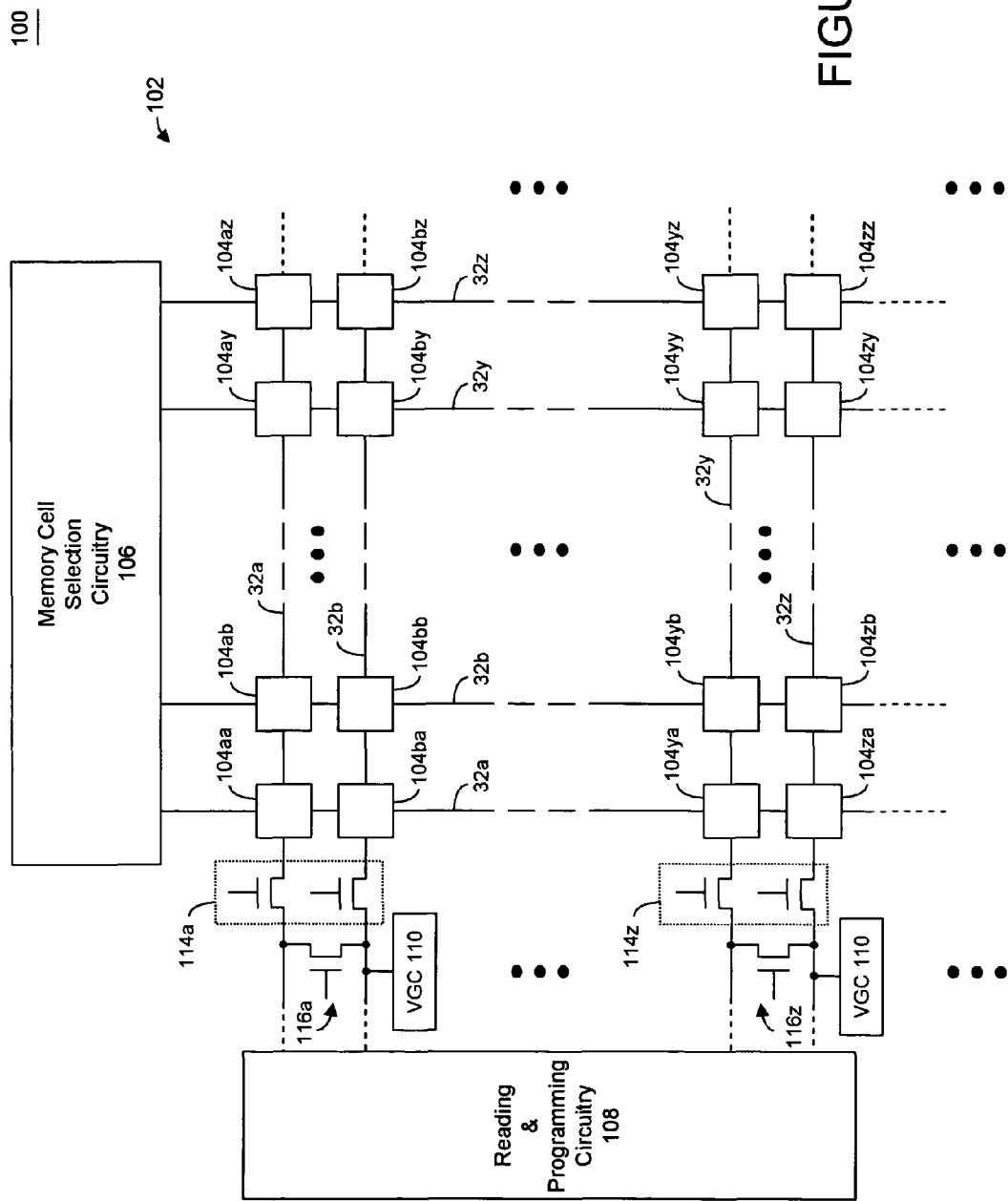
FIGS. 14 and 18 illustrate exemplary schematic block diagrams of exemplary embodiments of a memory cell array in conjunction with voltage generation circuitry coupled to two associated bitlines via a bitline coupling circuit, according to an aspect of the present inventions.

With continued reference to FIG. 14, bitlines 32a and 32b share a common voltage generation circuitry 110 via suitable control of bitline selection circuit 114a and bitline coupling circuit 116. In operation, bitline 32a may be raised to a voltage of Node N2 (for example, Vdd) and bitline 32 may be raised to a voltage of Node N3 (for example, Vss) by selectively and sequentially connecting voltage generation circuitry 110 to the bitlines 32a and 32b and enabling the appropriate transistors 112. Thereafter, voltage generation circuitry 110 may be disabled, the bitlines may be electrically floating at the predetermined voltages and bitline coupling circuit 116 may be enabled. In this way, bitlines 32a and 32b may be interconnected which provides or causes charge sharing between bitlines 32a and 32b. The bitlines 32a and 32b will equalize at a voltage of one-half of the difference between the voltage of Node N2 and voltage of Node N3 (which, in this example is one half of (Vdd−Vss) or Vdd/2). Thus, integrated circuit 100 of FIG. 14 allows local generation of a voltage on associated bitlines without interconnecting a (larger) group of bitlines (for example, a significant number of bitlines of an array or sub-array) to a common signal or common node.

Figure 15:
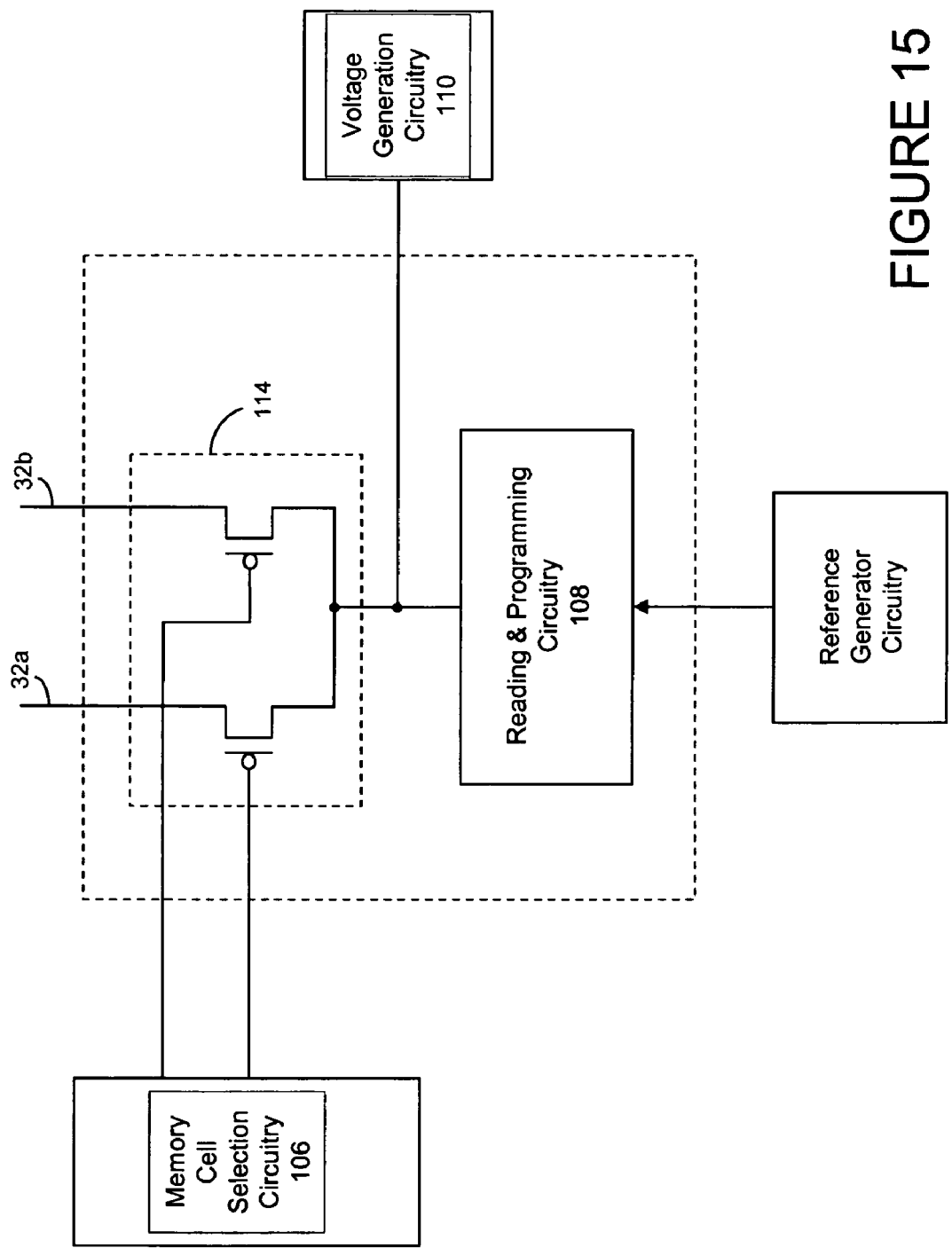
FIG. 15 is a schematic block diagram illustration of an embodiment of the bitline selection circuit, in conjunction with voltage generation circuitry, reading and programming circuitry, reference generator circuitry and memory cell selection circuitry, according to certain aspects of the present inventions.

As noted above, bitline selection circuitry 114 facilitates implementation of a shared sense amplifier architecture. In this regard, with reference to FIG. 15, in one embodiment, bitline selection circuit 114 selects one of two bitlines to connect to, among other things, the sense amplifier (not illustrated) and/or write back circuitry (not illustrated) of reading and programming circuitry 108. In one embodiment, bitlines selection circuit 114 includes two N-channel type transistors. (See, FIG. 14). In another embodiment, bitline selection circuit 114 may include two P-channel type transistors. (See, FIG. 15). Indeed, bitline selection circuit 114 may include an N-channel type transistor and a P-channel type transistor. In either exemplary embodiment, in response to control signals from memory selection circuitry 106, one of two associated bitlines 32 (for example, bitlines 32a or 32b) is connected to the appropriate circuitry (for example, a data sense amplifier and write circuit) in reading and programming circuitry 108. Notably, any bitline selection circuit whether now known or later developed (and which is consistent with the inventions hereof) is intended to fall within the scope of the present inventions.

Figure 16:
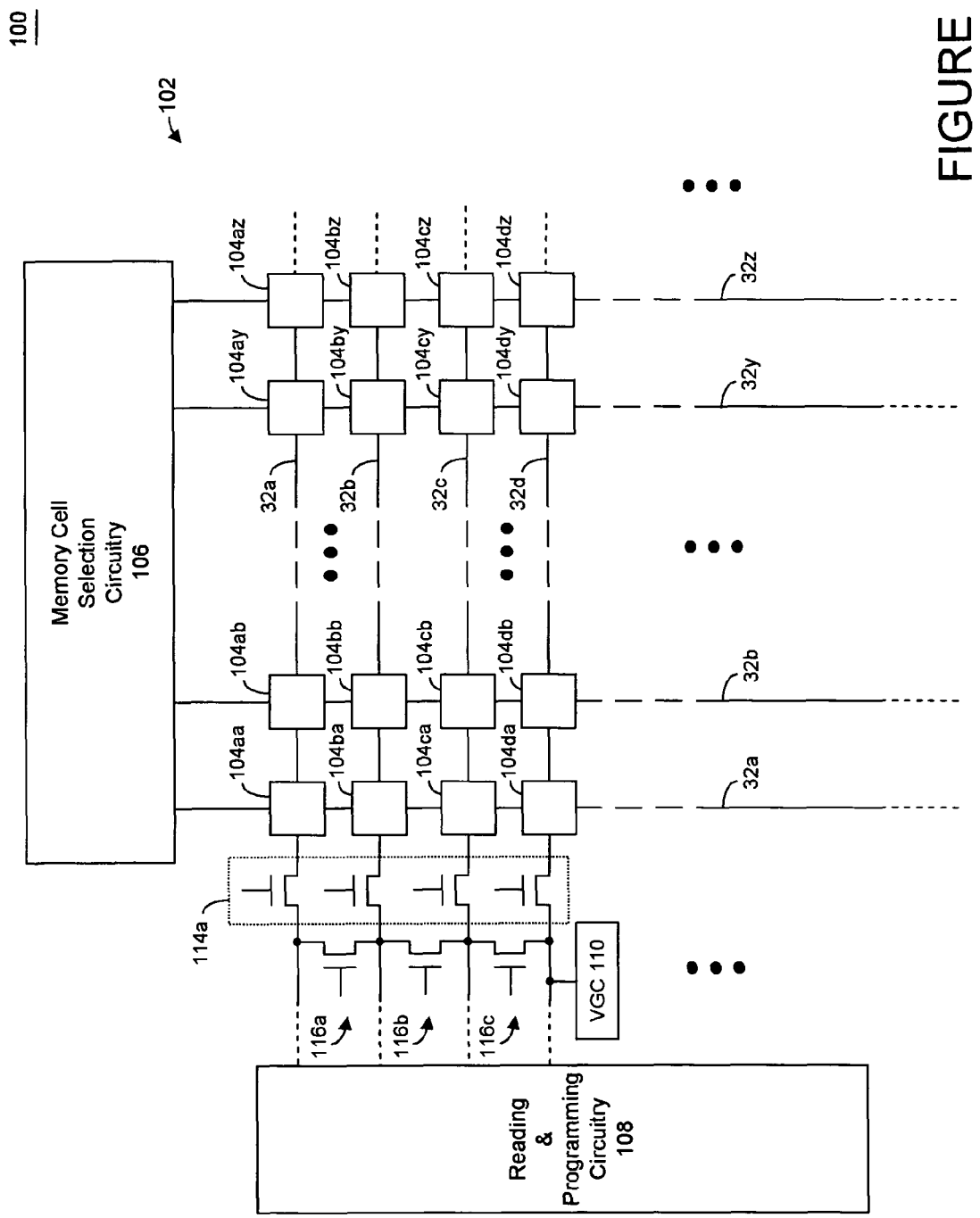
FIGS. 16 and 19 illustrate exemplary schematic block diagrams of exemplary embodiments of a memory cell array in conjunction with voltage generation circuitry coupled to four associated bitlines via bitline coupling circuits, according to an aspect of the present inventions.

In another embodiment, voltages may be locally generated on associated bitlines which share one or more common voltage generation circuitry 110 via suitable control of bitline selection circuit 114a and bitline coupling circuit 116. For example, with reference to FIG. 16, four bitlines may be connected together and/or controlled in the similar manner as described above. The resolution of voltage generation circuitry 110 of FIG. 16 may be increased by, for example, providing more than four bitlines per voltage generation circuitry 110. That is, the configuration of FIG. 16 may provide a voltage of one-quarter of the difference between the voltage of Node N2 and voltage of Node N3 (which, in this example is one quarter of (Vdd−Vss) or Vdd/4).

Figure 17:
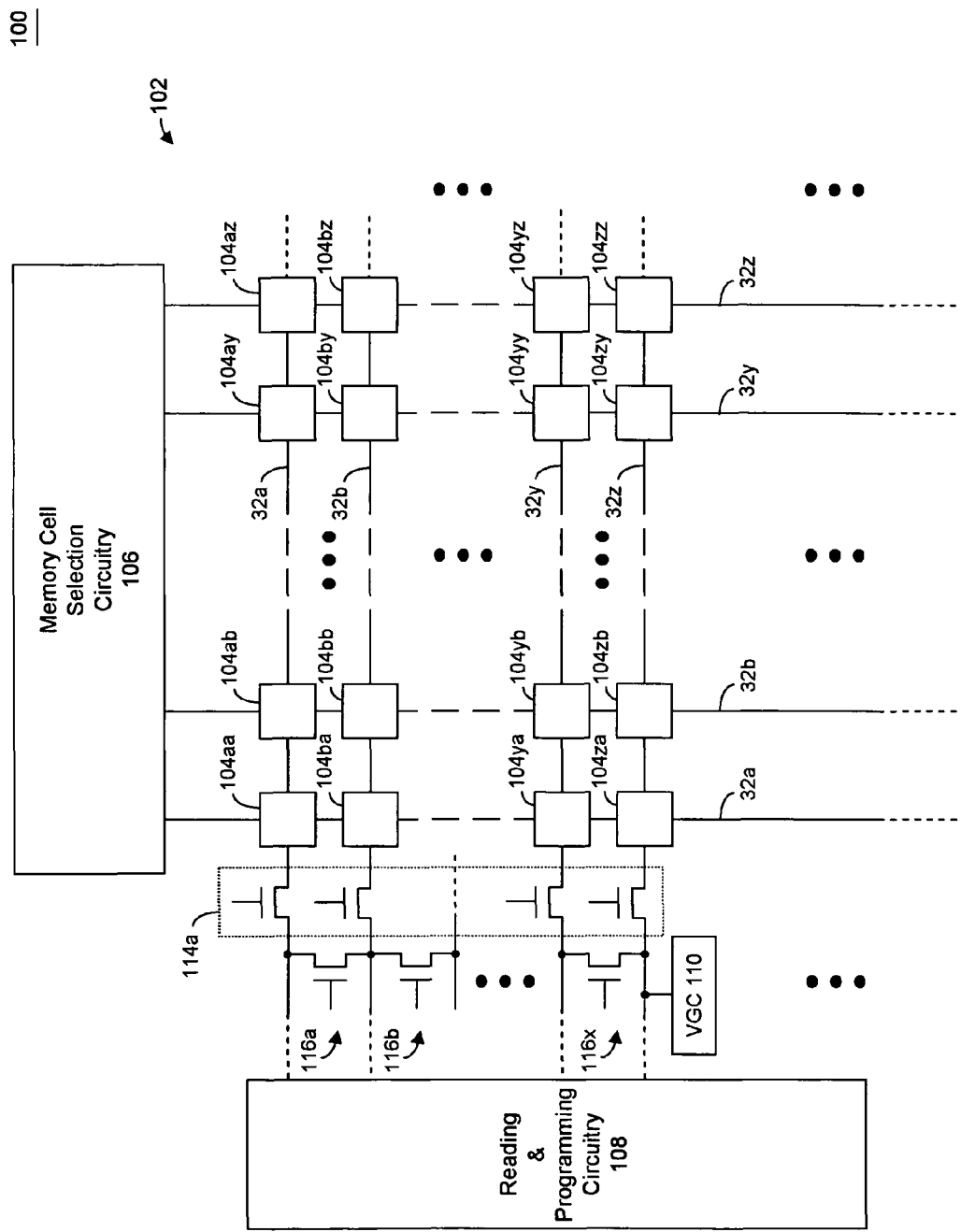
FIGS. 17 and 20 illustrate exemplary schematic block diagrams of exemplary embodiments of a memory cell array in conjunction with voltage generation circuitry coupled to "n" associated bitlines via one or more bitline coupling circuits, according to an aspect of the present inventions.
Figure 18:
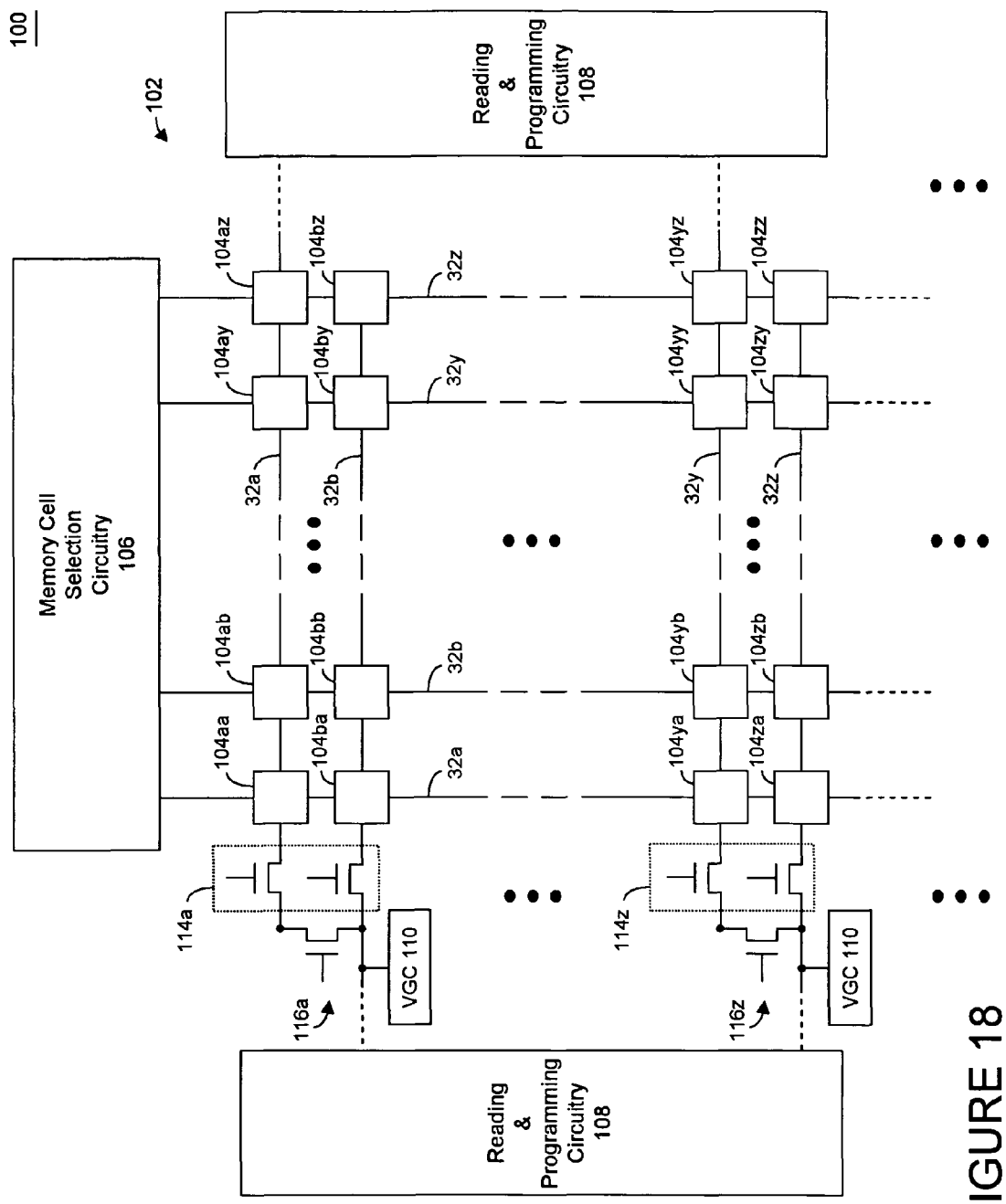
Figure 19:
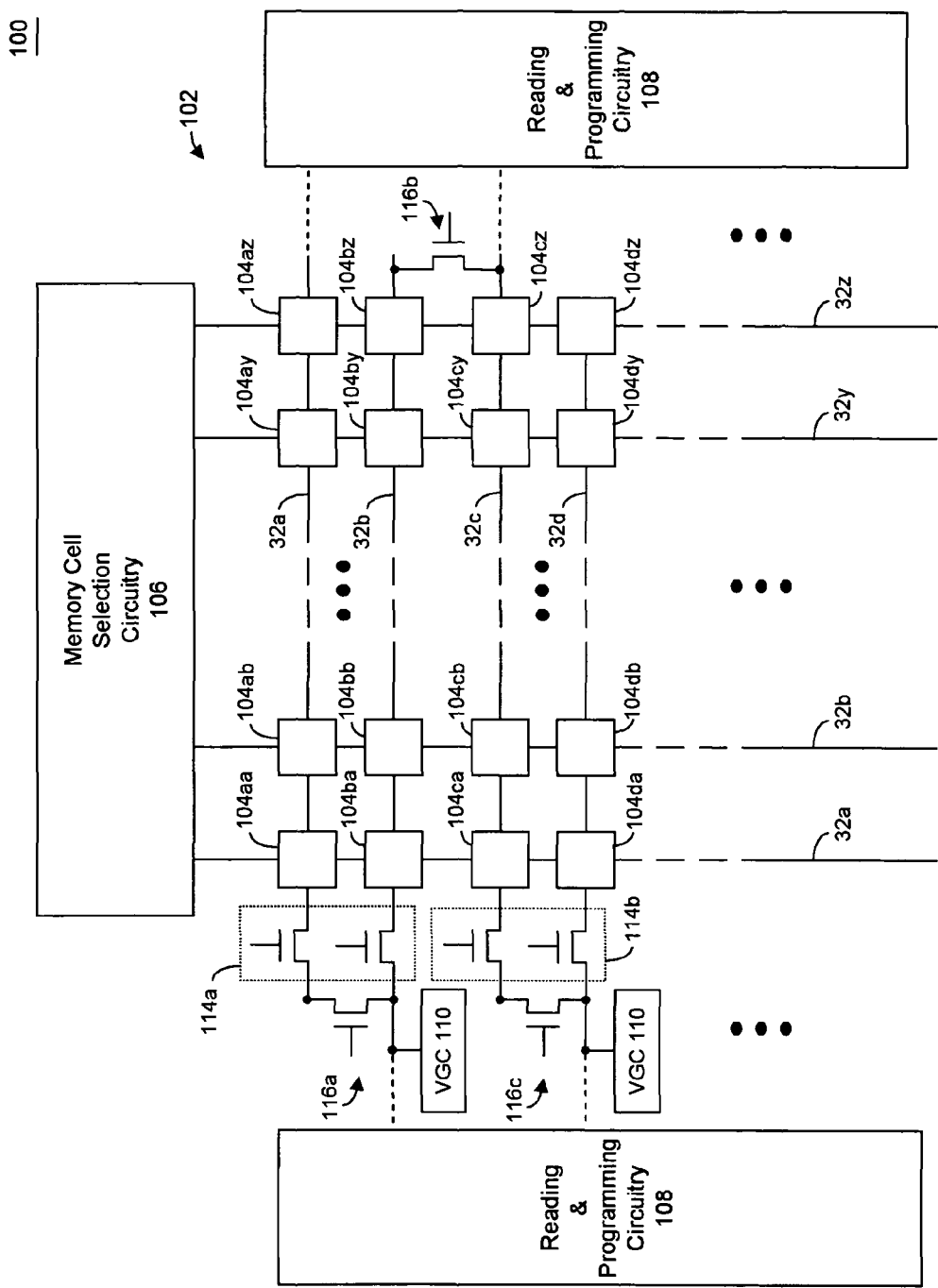
Figure 20:
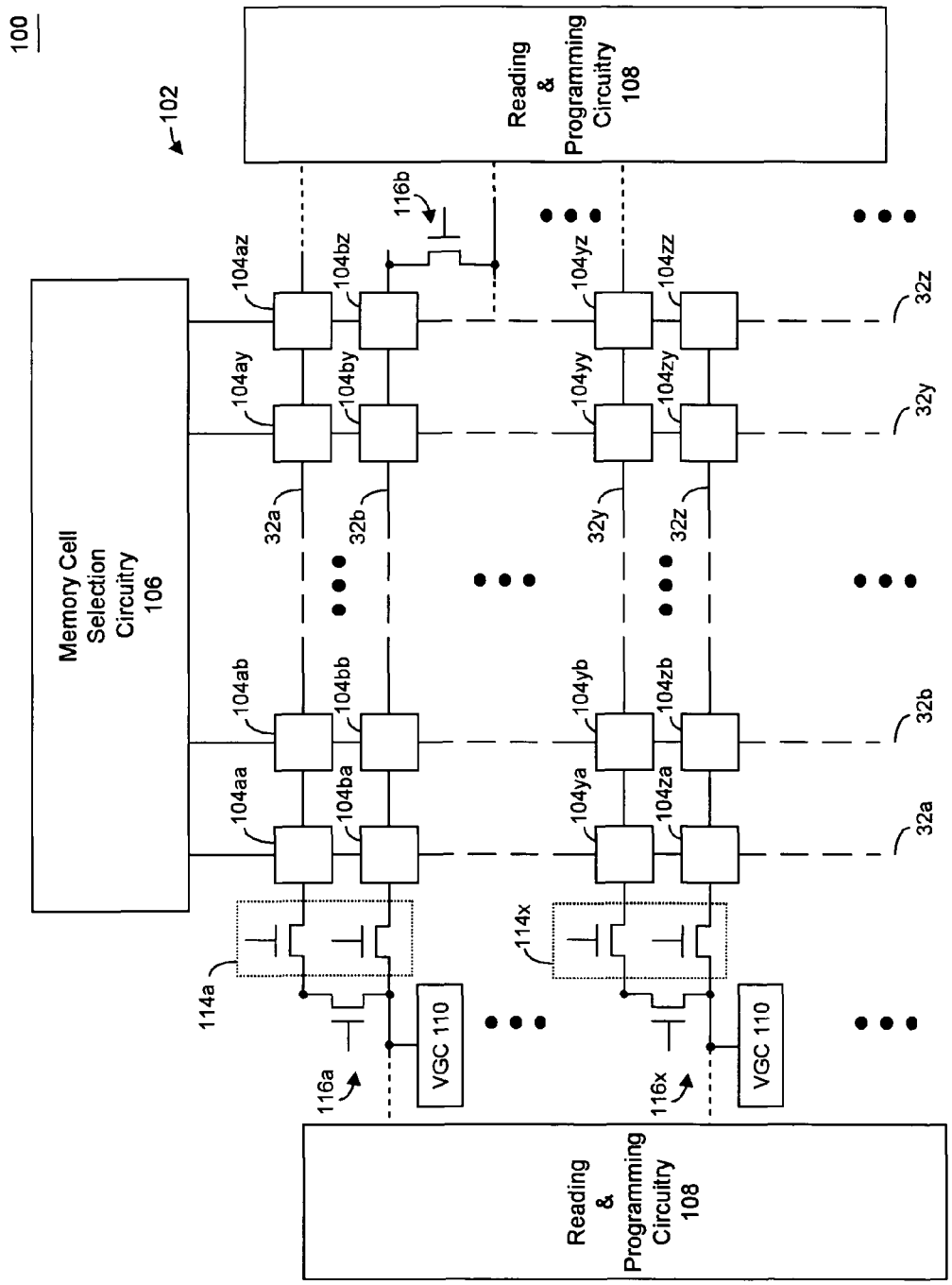
Figure 21:
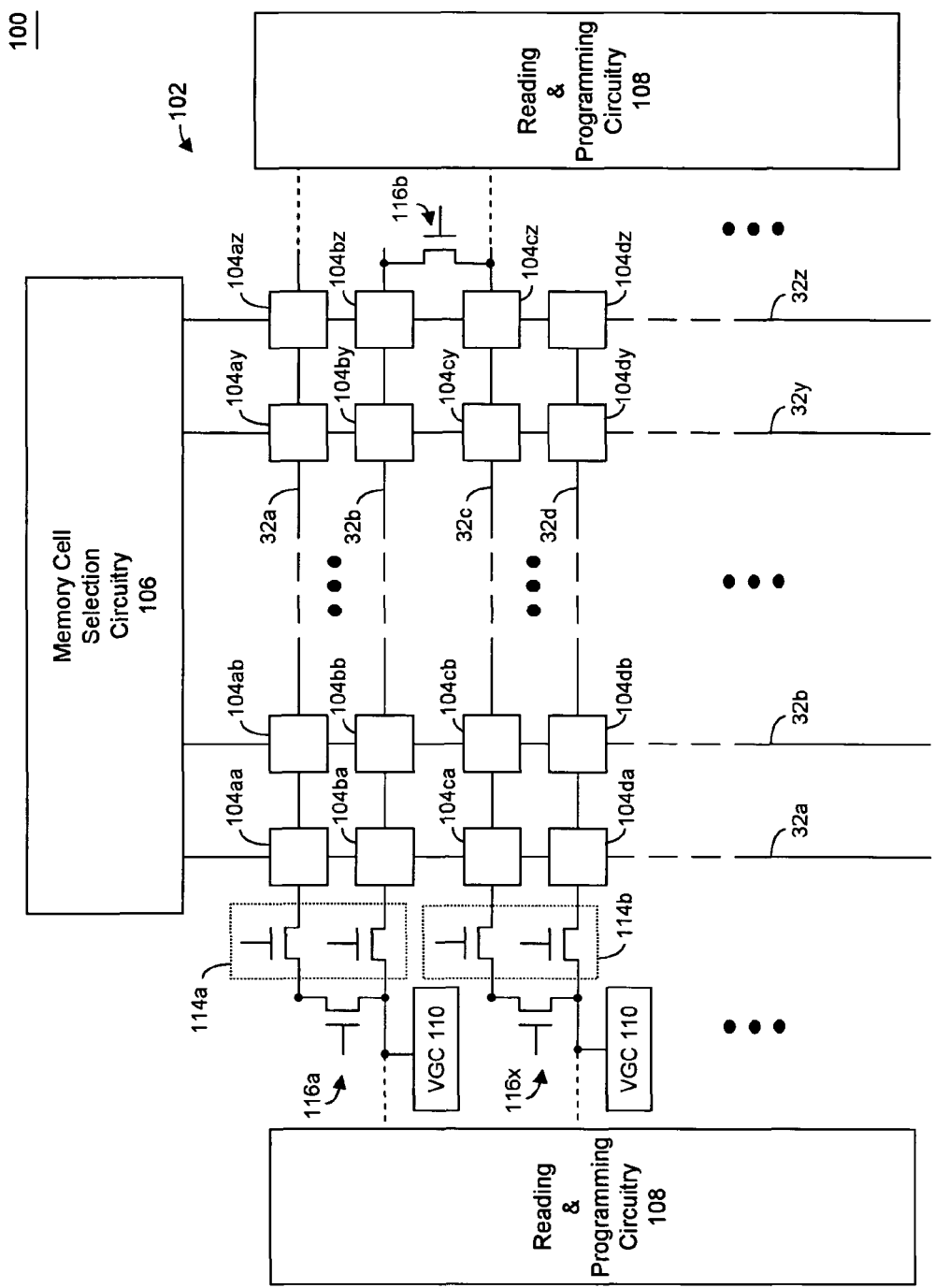
FIG. 21 illustrates an exemplary schematic block diagram of an exemplary embodiments of a memory cell array in conjunction with voltage generation circuitry coupled to two and/or four associated bitlines via one or more bitline coupling circuits, according to an aspect of the present inventions.

Indeed, with reference to FIG. 17, "n" bitlines may be connected together and thereby providing a voltage having a resolution of Vdd/n, where n is equal to the number of bitlines interconnected via bitline coupling circuit 116. Here, "n" may be an odd or even number that is greater than 2.

With continued reference to FIG. 17, the generated voltage (and/or resolution of the generated voltage) may be adjusted and/or determined in situ (i.e., in the field or during operation) by adjusting, incorporating and/or employing a suitable number of bitlines. In this regard, the number of bitlines "m" employed to generate the desired or predetermined voltage may be selected from 2 to "n", thereby provide a desired and/or predetermined resolution between the voltage of Node N2 and voltage of Node N3 (for example, (Vdd−Vss)/m where $2 \leq m \leq n$).

In another exemplary embodiment, reading and programming circuitry 108 may be disposed on multiple sides of memory cell array 102, for example, to more closely match the pitch of the memory cell array to sense amplifier circuitry in reading and programming circuitry 108. With reference to FIGS. 18-21, voltages may be locally generated on associated bitlines which share one or more common voltage generation circuitry 110. In FIGS. 18-21, such voltages are generated via suitable control of bitline selection circuit 114 and bitline coupling circuit 116. The operation and control of the embodiments of FIGS. 18-21 is similar to that discussed above in relation to FIGS. 14-17. For the sake of brevity, that discussion will not be repeated.

Notably, in the embodiments illustrated in FIGS. 18-21, bitline selection circuit 114 may or may not be employed to select one of two bitlines to connect to an associated sense amplifier (not illustrated) and/or associated write back circuitry (not illustrated) of reading and programming circuitry 108. For example, bitline selection circuitry 114 may be employed to select one of two bitlines to connect to the associated voltage generation circuitry 110 as well as select one or two bitlines (in different memory arrays—not illustrated) to connect to an associated sense amplifier and/or associated write back circuitry of reading and programming circuitry 108.

Figure 22:
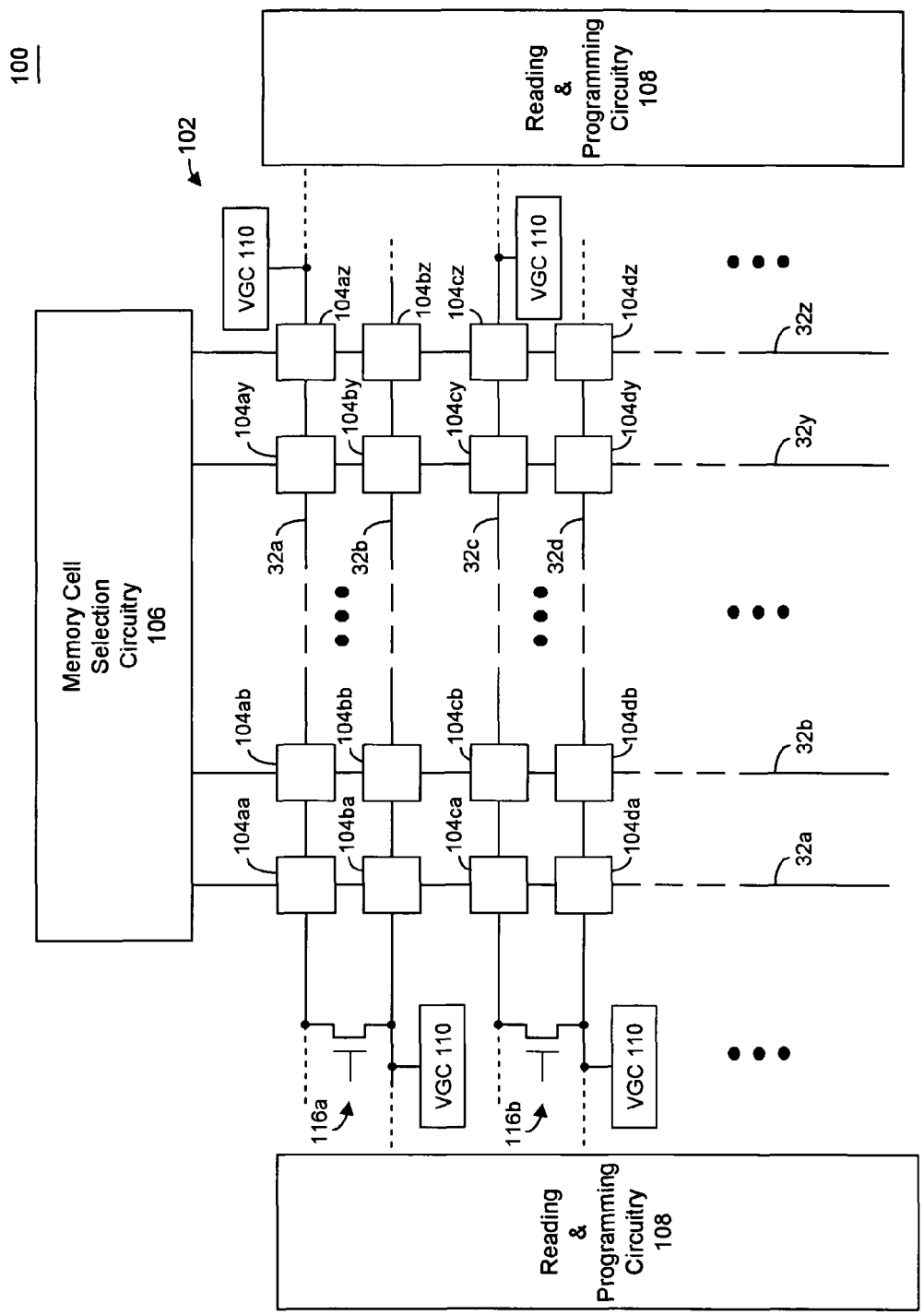
FIG. 22 illustrates an exemplary schematic block diagram of an exemplary embodiments of a memory cell array in conjunction with voltage generation circuitry coupled to two associated bitlines via a bitline coupling circuit, according to an aspect of the present inventions.
Figure 23:
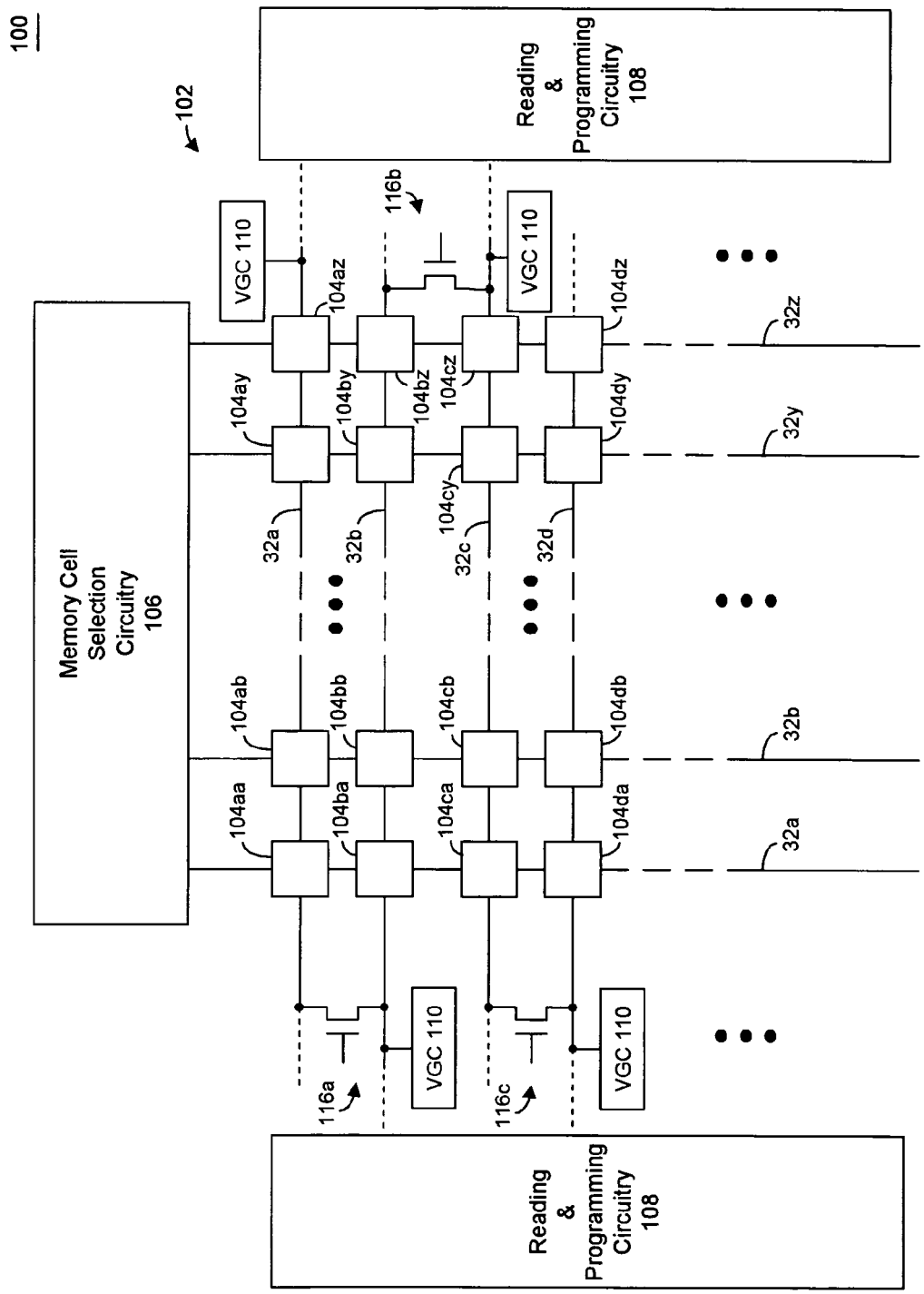
FIG. 23 illustrates an exemplary schematic block diagram of an exemplary embodiments of a memory cell array in conjunction with voltage generation circuitry coupled to two and/or four associated bitlines via bitline coupling circuits, according to an aspect of the present inventions.
Figure 24:
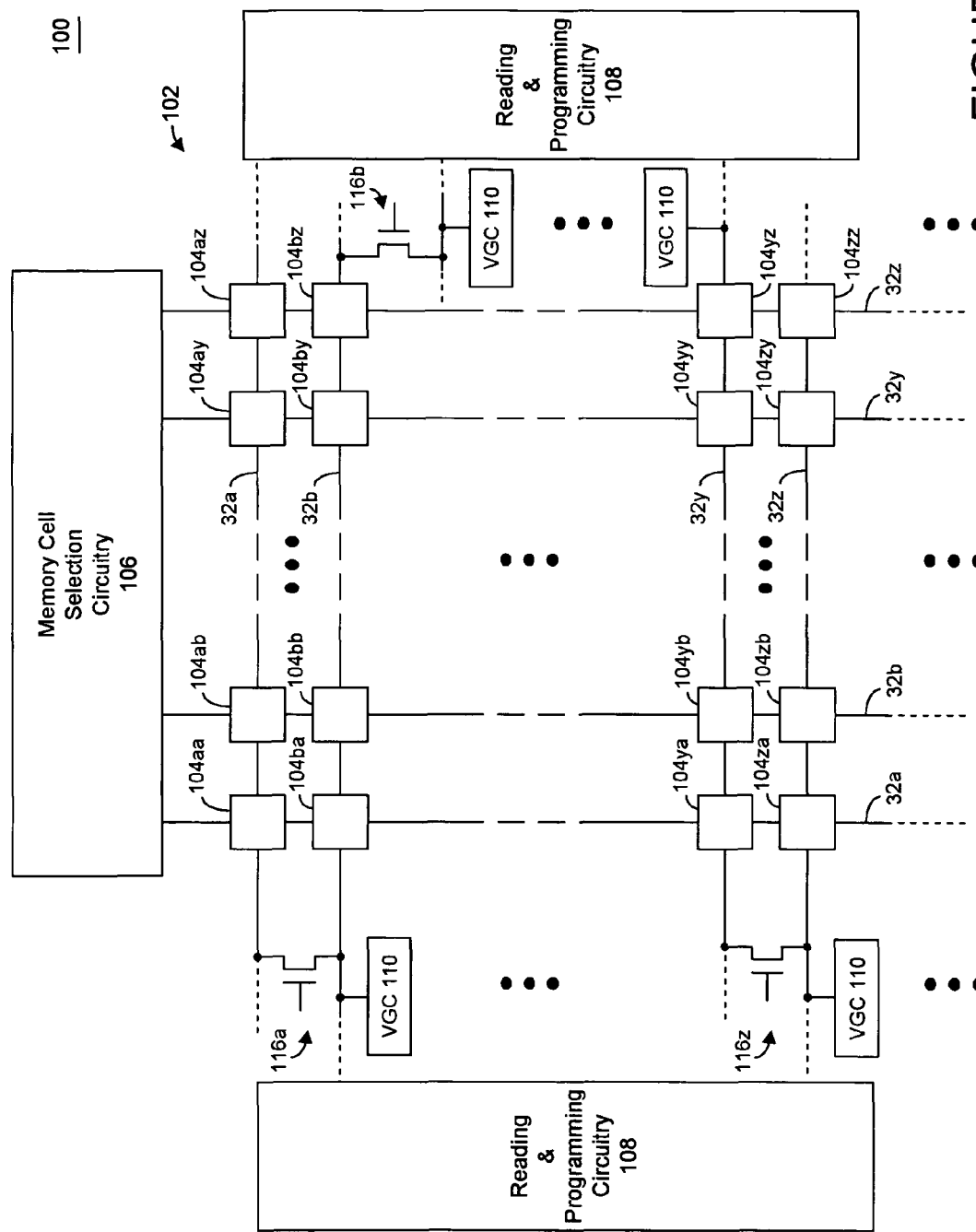
FIG. 24 illustrates an exemplary schematic block diagram of an exemplary embodiments of a memory cell array in conjunction with voltage generation circuitry coupled to "n" four associated bitlines via bitline coupling circuits, according to an aspect of the present inventions.

In yet another exemplary embodiment, voltages may be locally generated on associated bitlines which share one or more common voltage generation circuitry 110 via suitable control of bitline coupling circuit 116. The operation and control of the embodiments of FIGS. 22-24 is similar to that discussed above in relation to FIGS. 14-17. For the sake of brevity, that discussion will not be repeated.

Figure 25B:
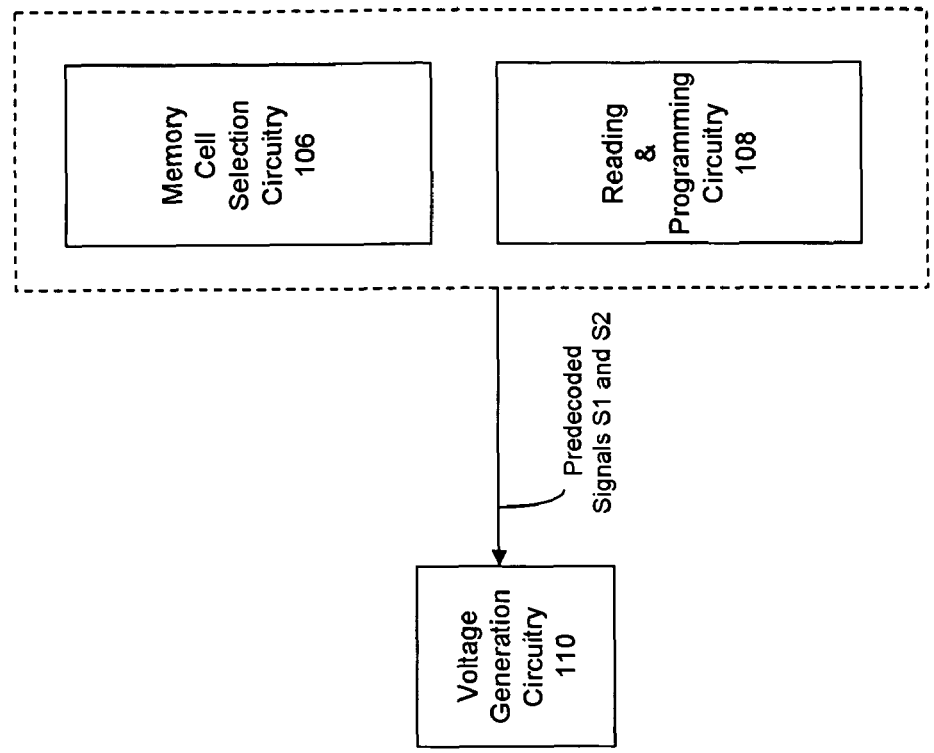
FIG. 25B illustrates an exemplary schematic block diagram of decoding circuitry for the voltage generation circuitry of FIGS. 12B, 12C and 12D.
Figure 25A:
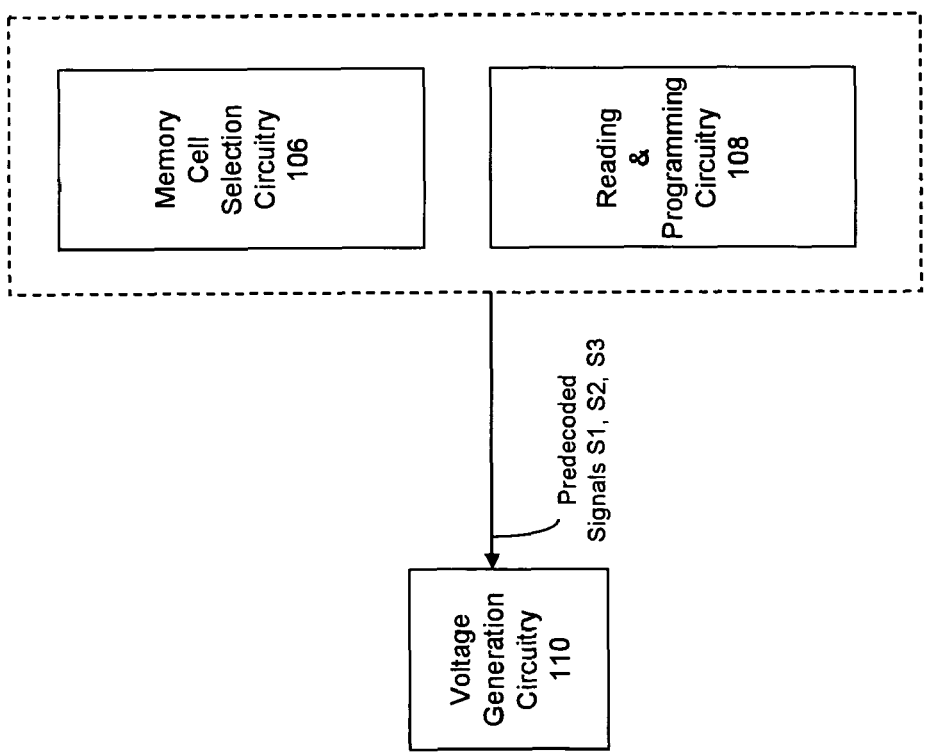
FIG. 25A illustrates an exemplary schematic block diagram of decoding circuitry for the voltage generation circuitry of FIG. 12A.

The signals to control the voltage generation circuitry and/or bitline coupling circuits may employ predecoded using address data (for example, row and/or column address data) or other data used in the reading, writing or other memory operations. (See, for example, FIGS. 25A and 25B). Indeed, all techniques and circuitry for generating control signals S1, S2 and S3, as well as control signals for the bitline coupling circuits, which are consistent with the characteristics described herein, are intended to fall within the scope of the present inventions.

Notably, in one exemplary embodiment, a first portion of the process may be to determine how many bitlines are desired to be at a voltage of Vdd/2. To minimize power expenditure, the number of bitlines used to generate the desired voltage (in this case Vdd/2) should be equal to the number of bitlines required to provide the desired voltage. For example, if an array has 1,024 bitlines and 256 bitlines need to be driven to Vdd/4, then only 256 bitlines should be chosen for the operation. Of these 256 bitlines, a decoding operation should select 25% (64 bitlines) to be driven to Vdd through transistors 112b of the associated voltage generation circuitry 110 which will later be charge shared with the remaining 75% (192 bitlines) that are driven to VSS via transistors 112c of the voltage generation circuitry 110 associated therewith.

It may be advantageous to employ a larger number of bitlines to minimize, reduce and/or eliminate any variation due to capacitance differences between different bitlines. This may be advantageous in situations where the operation only requires a small quantity of bitlines or when the generated supply is going to be used for other purposes beyond driving the selected bitlines to Vdd/4. For example, where a locally generated Vdd/4 supply may be employed by memory cell array 102 such as a sense amplifier reference voltage or word line voltage (used for certain memory operations).

The number of bitlines selected to generate the desired voltage may be determined based on the bitline capacitance, the expected load on the supply, and the voltage tolerance desired. For example, where the loading is small, the number of bitlines used to generate a supply may be reduced.

Another variable/consideration that may be advantageous to implement in the process is the frequency at which the operation is performed. Higher frequency operation may be used to improve the load tolerance. For example, assume that a nominal supply voltage of Vdd/2 is desired, Vdd is equal to 1.0 volts, and further assume that the load on this supply will be 10 uA for a duration of 10 ns and the target voltage is between 0.6 volts and 0.4 volts. In addition, for this analysis, further assume the bitline capacitance is 100 fF/bitline. By starting the voltage at 0.6 volts, the number of bitlines that may be used to generate the 0.5 volts nominal supply becomes:

$$I = C\, dV/dt$$

$$I = Cbitline * \text{\# of bitlines} * dV/dt$$

$$\text{\# of bitlines} = I/Cbitline * dt/dV$$

$$= (10 \times 10^{-6}/100 \times 10^{-15}) * (10 \times 10^{-9}/0.2)$$

$$= 5 \text{ bitlines minimum}$$

Under these circumstances, three bitlines may be driven to a first voltage, for example, 1 volt (here Vdd) and two bitlines to a second voltage, for example, ground (0 volt). Interconnecting those bitlines using any embodiment described above would result in a starting voltage of 0.6 volts. After 10 ns of a 10 uA load, the voltage may be 0.4 volts. Notably, margin to the spec may be obtained by using a larger number of bitlines to generate the power supply. For example, if ten bitlines were used instead of five as discussed above, the voltage drop in the 10 ns window would be limited to 100 mv, not 200 mv and the supply may then be controlled to 0.55 volts+/−0.05 volts.

As indicated above, the most direct application of this voltage is to apply the generated voltages to the bitlines, for example, during certain memory operations. However, the supply voltages may be provided to other circuitry of integrated circuit device 100, for example, the sense amplifier circuitry or circuitry less related to memory cell array 102, memory cells 104, memory cell selection circuitry 106 and/or data sense/write circuitry 108.

Indeed, with a robust or strong power supply (for example, Vdd) and voltage grid, these inventions may facilitate generation of voltages having precise voltage levels. Moreover, the operation or generation of the voltages may be synchronous and associated with typical read, write or refresh operations or could be asynchronous, for example, triggered by voltage level drops or other physical events.

Figure 26A:
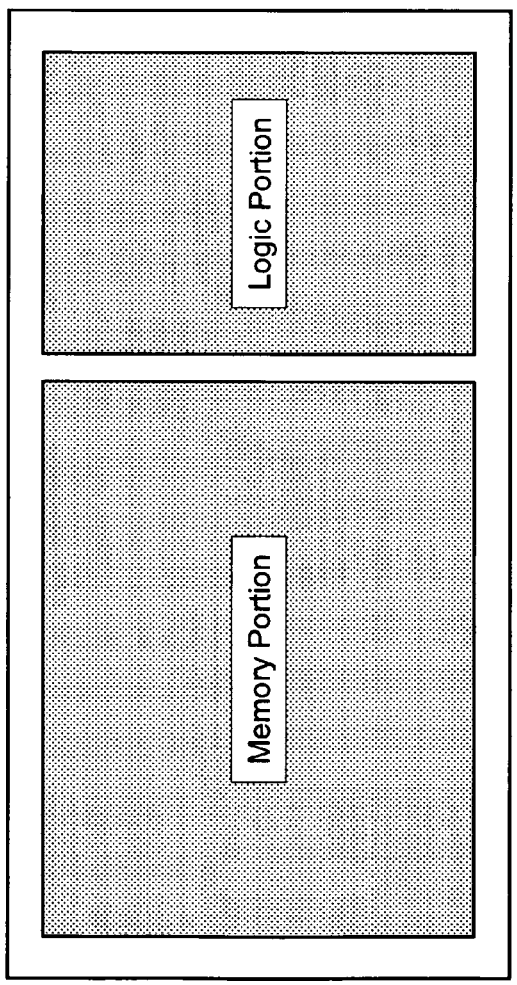
Figure 26B:
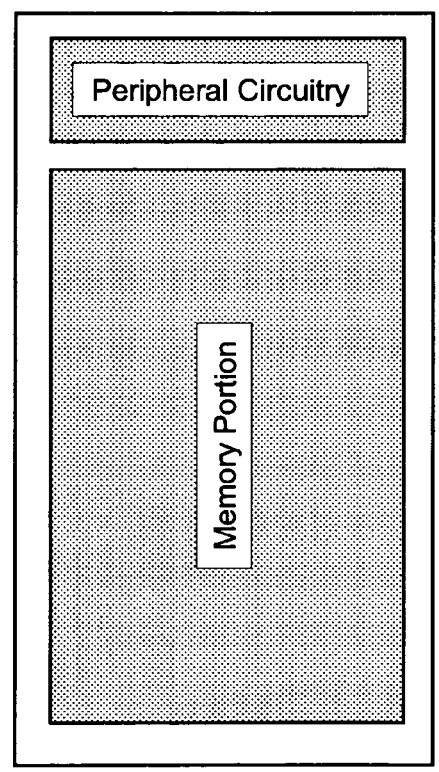
Figure 26C:
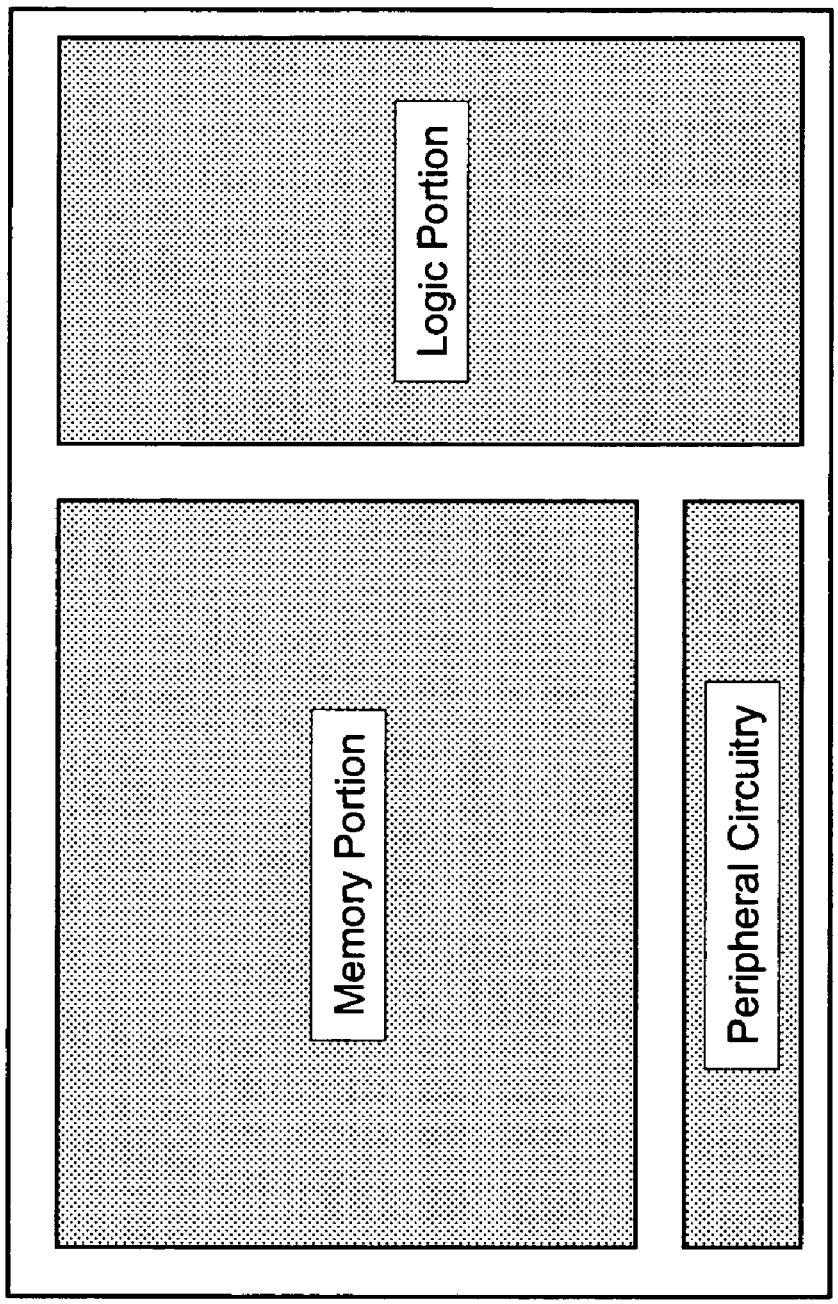

As mentioned above, the present inventions may be implemented in a logic device having a memory portion and logic portion (see, for example, FIGS. 26A and 26C), or an integrated circuit that is primarily a memory device (see, for example, FIG. 26B). The logic device may be, for example, a processor, controller, field programmable gate array, state machine, and/or a device including same. Indeed, the present inventions may be implemented in any device employing a memory array and redundancy architecture or technique.

Further, as mentioned above, the present inventions may be employed in conjunction with any memory cell technology now known or later developed. For example, the present inventions may be implemented in conjunction with a memory array, having a plurality of memory cells each including an electrically floating body transistor. (See, for example, (1) Fazan et al., U.S. Pat. No. 6,969,662, (2) Okhonin et al., U.S. Pat. No. 7,301,838, (3) Okhonin et al., U.S. Patent Application Publication No. 2007/0058427 ("Memory Cell and Memory Cell Array Having an Electrically Floating Body Transistor, and Methods of Operating Same"), (4) Okhonin, U.S. Patent Application Publication No. 2007/0138530, ("Electrically Floating Body Memory Cell and Array, and Method of Operating or Controlling Same"), and (5) Okhonin et al., U.S. Patent Application Publication No. 2007/0187775, ("Multi-Bit Memory Cell Having Electrically Floating Body Transistor, and Method of Programming and Reading Same"). In this regard, the memory cell may consist of a PD or a FD SOI transistor (or transistor formed on or in bulk material/substrate) having a gate, which is disposed adjacent to the electrically floating body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor.

The memory cells of the memory cell array may be comprised of N-channel, P-channel and/or both types of transistors. Indeed, circuitry that is peripheral to the memory array (for example, sense amplifiers or comparators, row and column address decoders, as well as line drivers (not illustrated in detail herein)) may include P-channel and/or N-channel type transistors. Where N-channel type transistors or P-channel type transistors are employed as memory cells 12 in the memory array(s) 10, suitable write and read voltages are well known to those skilled in the art (and in view of the U.S. patents and U.S. patent applications incorporated herein by reference).

Moreover, the present inventions may be implemented in conjunction with any memory cell array configuration and/or arrangement of memory cell array 10. In this regard, integrated circuit device (for example, memory or logic device) may include a plurality of memory cell arrays, each having a plurality of memory cells, wherein certain of the circuitry (for example, redundancy address evaluation circuitry 50) is dedicated to one or more arrays and controller circuitry 64 is shared among the arrays.

In addition, the present inventions may be employed or implemented in conjunction with one or more of the inventions, memory cells, memory arrays, and techniques for programming, reading, controlling and/or operating a memory cell and array including, for example, (1) Okhonin et al., U.S. Pat. No. 7,301,838, (2) Okhonin et al., U.S. Patent Application Publication No. 2007/0058427 ("Memory Cell and Memory Cell Array Having an Electrically Floating Body Transistor, and Methods of Operating Same"), (3) Okhonin, U.S. Patent Application Publication No. 2007/0138530, ("Electrically Floating Body Memory Cell and Array, and Method of Operating or Controlling Same"), and (4) Okhonin et al., U.S. Patent Application Publication No. 2007/0187775, ("Multi-Bit Memory Cell Having Electrically Floating Body Transistor, and Method of Programming and Reading Same"). The entire contents of these U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

In addition, the memory cells may be arranged, configured and/or controlled using any of the memory cell arrays, architectures and/or control/operation techniques. For example, the memory cells may be arranged, configured and/or controlled using any of the memory cell arrays, architectures and/or control/operation techniques described and illustrated in the following U.S. patent applications:

(1) Application Ser. No. 10/450,238, which was filed by Fazan et al. on Jun. 10, 2003 and entitled "Semiconductor Device" (now U.S. Pat. No. 6,969,662);

(2) Application Ser. No. 10/487,157, which was filed by Fazan et al. on Feb. 18, 2004 and entitled "Semiconductor Device" (now U.S. Pat. No. 7,061,050);

(3) Application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) Application Ser. No. 11/079,590, which was filed by Ferrant et al. and entitled "Semiconductor Memory Device and Method of Operating Same" (now U.S. Pat. No. 7,187,581); and (5) Application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (now U.S. Pat. No. 7,184,298).

The entire contents of these five (5) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference.

Notably, the present inventions may be fabricated using well known techniques and/or materials. Indeed, any fabrication technique and/or material, whether now known or later developed, may be employed to fabricate the memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating body transistors, memory cells, and/or memory array(s) may employ the techniques described and illustrated in U.S. Pat. No. 7,335,934, by Fazan, ("Integrated Circuit Device, and Method of Fabricating Same") and/or U.S. Patent Application Publication No. 2007/0085140, by Bassin, ("One Transistor Memory Cell having a Strained Electrically Floating Body Region, and Method of Operating Same") (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Further, in one embodiment, an integrated circuit device includes memory section (having a plurality of memory cells, for example, PD or FD SOI memory transistors) and logic section (having, for example, high performance transistors, such as FinFET, multiple gate transistors, and/or non-high performance transistors (for example, single gate transistors that do not possess the performance characteristics of high performance transistors—not illustrated)). Moreover, as noted above, the memory cell and/or memory cell array, as well as the circuitry of the present inventions may be implemented in an integrated circuit device having a memory portion and a logic portion (see, for example, FIGS. 26A and 26C), or an integrated circuit device that is primarily a memory device (see, for example, FIG. 26B). The memory array may include a plurality of memory cells arranged in a plurality of rows and columns wherein each memory cell includes a transistor (whether fabricated in a bulk-type material or SOI material), for example, an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

The above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

Figure 27B:
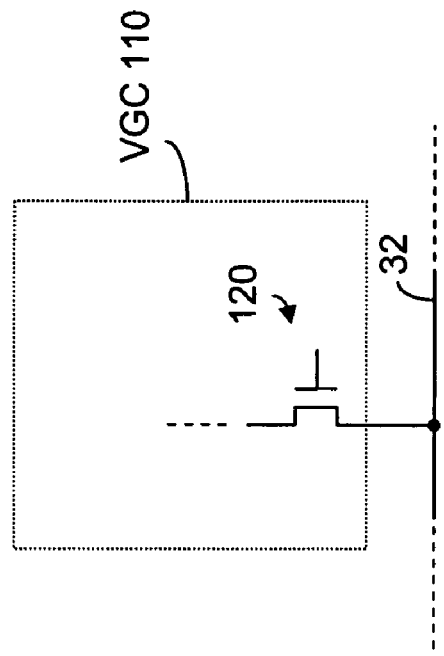
FIGS. 27A and 27B are exemplary schematic block diagram illustrations of voltage generation circuitry which includes a switch (FIG. 27A) or a transistor (FIG. 27B) to selectively and responsively connect voltage generation circuitry to one or more of the associated bit lines and/or to disconnect voltage generation circuitry from one or more of the associated bit lines.
Figure 27A:
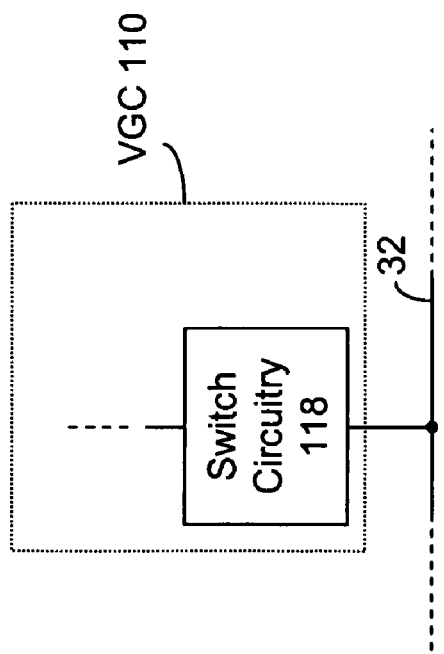

For example, voltage generation circuitry 110 may be selectively coupled to and/or de-coupled from one or more of the associated bit lines. In this regard, in one embodiment, with reference to FIG. 27A, voltage generation circuitry 110 may include switch circuitry 118 to selectively and responsively connect voltage generation circuitry 110 to one or more of the associated bit lines and/or to disconnect voltage generation circuitry 110 from one or more of the associated bit lines. In one embodiment, switch circuitry 118 includes one or more transistors 120 (see, for example, FIG. 27B). The switch circuitry (including transistor(s)) may be dedicated to a voltage generation circuit and the associated bit line(s) or shared between a plurality of "pairs" of or associated voltage generation circuit—associated bit line(s).

It should be noted that the term "circuit" may mean, among other things, a single component (for example, electrical/electronic and/or microelectromechanical) or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, or a combination of one or more circuits (whether integrated or otherwise), one or more state machines, one or more processors, and/or one or more processors implementing software. The term "data" may mean, among other things, a current or voltage signal(s) whether in an analog or a digital form.

What is claimed is:

1. An integrated circuit device comprising:
    memory cell array including (i) a plurality of memory cells, arranged in a matrix of rows and columns, and (ii) a plurality of bit lines, wherein each bit line includes a plurality of associated memory cells coupled thereto; and
    voltage generation circuitry, coupled to a plurality of the bit lines, to (i) apply a first voltage to a first group of associated bit lines, and (ii) apply a second voltage to a second group of associated bit lines, and (iii) generate a third voltage by connecting the first group of associated bit lines and the second group of associated bit lines, and (iv) output the third voltage.

2. The integrated circuit device of claim 1 wherein the number of bit lines in the first group of associated bit lines is the same as the number of bit lines in the second group of associated bit lines.

3. The integrated circuit device of claim 1 wherein the number of bit lines in the first group of associated bit lines is different from the number of bit lines in the second group of associated bit lines.

4. The integrated circuit device of claim 1 wherein the number of bit lines in the first or second group of associated bit lines is equal to or greater than two.

5. The integrated circuit device of claim 1 wherein the number of bit lines in the first or second group of associated bit lines is equal or greater than five.

6. The integrated circuit device of claim 1 wherein the voltage generation circuitry includes a switch circuitry to responsively couple and/or de-couple the voltage generation circuitry to/from the first or second group of associated bit lines.

7. The integrated circuit device of claim 1 wherein the voltage generation circuitry includes:
    a first voltage generation circuit, coupled to the first group of associated bit lines, to (i) selectively apply the first voltage to the first group of associated bit lines and (ii) thereafter connect the first group of associated bit lines to a common connection point or node; and
    a second voltage generation circuit, coupled to the second group of associated bit lines, to (i) selectively apply the second voltage to the second group of associated bit lines and (ii) thereafter connect the second group of associated bit lines to the common connection point or node.

8. The integrated circuit device of claim 7 wherein the common connection point or node is the output node of the voltage generation circuitry.

9. The integrated circuit device of claim 8 further including power supply circuit, wherein the common connection point or node is connected to the power supply circuit.

10. The integrated circuit device of claim 7 wherein in response to connecting the first group of associated bit lines and the second group of associated bit lines, the electrical charge on the first group of associated bit lines is shared with second group of associated bit lines to generate the third voltage.

11. An integrated circuit device comprising:
    memory cell array including (i) a plurality of memory cells, arranged in a matrix of rows and columns, and (ii) a plurality of bit lines, wherein each bit line includes a plurality of associated memory cells coupled thereto, wherein the plurality of memory cells each includes an electrically floating body transistor including a body region which is electrically floating, and wherein each memory cell is programmable to store one of a plurality of data states including (i) a first data state representative of a first charge in the body region of the transistor, and (ii) a second data state representative of a second charge in the body region of the transistor; and
    voltage generation circuitry, coupled to a plurality of the bit lines, to (i) concurrently (a) apply a first voltage to a first group of associated bit lines and (b) apply a second voltage to a second group of associated bit lines, and (ii) generate a third voltage by connecting the first group of associated bit lines and the second group of associated bit lines, and (iii) output the third voltage.

12. The integrated circuit device of claim 11 wherein the number of bit lines in the first group of associated bit lines is the same as the number of bit lines in the second group of associated bit lines.

13. The integrated circuit device of claim 11 wherein the number of bit lines in the first or second group of associated bit lines is equal to or greater than five.

14. The integrated circuit device of claim 11 wherein the number of bit lines in the first group of associated bit lines is different from the number of bit lines in the second group of associated bit lines.

15. The integrated circuit device of claim 11 wherein the voltage generation circuitry includes a switch circuitry to responsively couple and/or de-couple the voltage generation circuitry to/from the first or second group of associated bit lines.

16. The integrated circuit device of claim 11 wherein the voltage generation circuitry includes:
   a first voltage generation circuit, coupled to the first group of associated bit lines, to (i) selectively apply the first voltage to the first group of associated bit lines and (ii) thereafter connect the first group of associated bit lines to a common connection point or node;
   a second voltage generation circuit, coupled to the second group of associated bit lines, to (i) selectively apply the second voltage to the second group of associated bit lines and (ii) thereafter connect the second group of associated bit lines to the common connection point or node; and
   wherein the common connection point or node is the output of the voltage generation circuitry.

17. The integrated circuit device of claim 16 further including power supply circuit, wherein the common connection point or node is connected to the power supply circuit.

18. An integrated circuit device comprising:
   memory cell array including (i) a plurality of memory cells, arranged in a matrix of rows and columns, and (ii) a plurality of bit lines, wherein each bit line includes a plurality of associated memory cells coupled thereto; and
   voltage generation means for (i) applying a first voltage to a first group of associated bit lines, and (ii) applying a second voltage to a second group of associated bit lines, and (iii) generating a third voltage by connecting the first group of associated bit lines and the second group of associated bit lines, and (iv) output the third voltage.

19. The integrated circuit device of claim 18 wherein the number of bit lines in the first group of associated bit lines is different from the number of bit lines in the second group of associated bit lines.

20. The integrated circuit device of claim 18 wherein the number of bit lines in the first or second group of associated bit lines is equal to or greater than five.

21. The integrated circuit device of claim 18 wherein the voltage generation means further includes a switch means for responsively coupling and/or de-coupling the voltage generation means to/from the first or second group of associated bit lines.

22. The integrated circuit device of claim 18 wherein the plurality of memory cells each includes an electrically floating body transistor including a body region which is electrically floating, and wherein each memory cell is programmable to store one of a plurality of data states including (i) a first data state representative of a first charge in the body region of the transistor, and (ii) a second data state representative of a second charge in the body region of the transistor.

23. The integrated circuit device of claim 18 wherein the voltage generation means includes:
   a first voltage generation means, coupled to the first group of associated bit lines, for (i) selectively applying the first voltage to the first group of associated bit lines and (ii) thereafter connecting the first group of associated bit lines to a common connection point or node;
   a second voltage generation means, coupled to the second group of associated bit lines, for (i) selectively applying the second voltage to the second group of associated bit lines and (ii) thereafter connecting the second group of associated bit lines to the common connection point or node; and
   wherein the common connection point or node is the output of the voltage generation means.

* * * * *